US012696649B2

(12) United States Patent
Lee et al.

(10) Patent No.: US 12,696,649 B2
(45) Date of Patent: Jul. 28, 2026

(54) TRANSPARENT TOUCH DISPLAY DEVICE

(71) Applicant: LG Display Co., Ltd., Seoul (KR)

(72) Inventors: Hwi Deuk Lee, Paju-si (KR); Sung Su Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 456 days.

(21) Appl. No.: 18/519,313

(22) Filed: Nov. 27, 2023

(65) Prior Publication Data

US 2024/0215374 A1 Jun. 27, 2024

(30) Foreign Application Priority Data

Dec. 27, 2022 (KR) ........................ 10-2022-0185649

(51) Int. Cl.
| | |
|---|---|
| *H10K 59/40* | (2023.01) |
| *G06F 3/041* | (2006.01) |
| *G06F 3/044* | (2006.01) |
| *H10K 59/124* | (2023.01) |

(52) U.S. Cl.
CPC ........... *H10K 59/40* (2023.02); *G06F 3/0412* (2013.01); *G06F 3/04164* (2019.05); *G06F 3/0446* (2019.05); *H10K 59/124* (2023.02); *G06F 3/0418* (2013.01); *G06F 2203/04111* (2013.01)

(58) Field of Classification Search
CPC ...................................................... H10K 59/40
USPC ........................................................... 257/88
See application file for complete search history.

(56) References Cited

U.S. PATENT DOCUMENTS

| | | | |
|---|---|---|---|
| 2017/0205931 A1 | 7/2017 | Han et al. | |
| 2021/0026477 A1* | 1/2021 | Lee .................... | G06F 3/04164 |
| 2021/0026478 A1* | 1/2021 | Lee ........................ | G06F 3/0446 |
| 2021/0200417 A1* | 7/2021 | Kim .................... | G06F 3/04164 |
| 2022/0004282 A1 | 1/2022 | Lee et al. | |
| 2022/0197441 A1 | 6/2022 | Choi et al. | |
| 2022/0397971 A1 | 12/2022 | Yang et al. | |
| 2023/0214036 A1 | 7/2023 | Kim et al. | |

OTHER PUBLICATIONS

Search Report issued on May 17, 2024 in Great Britain Patent Application No. GB2318649.7.

* cited by examiner

*Primary Examiner* — Ajay Arora
(74) *Attorney, Agent, or Firm* — Morgan, Lewis & Bockius LLP

(57) ABSTRACT

Disclosed is a transparent touch display device including: first to third touch electrodes disposed in one column; first to third touch lines disposed across the first to the third touch electrodes; m×n touch cathode electrodes disposed in n rows and m columns in an area of each of the first to the third touch electrodes (m and n being natural numbers); and n touch bridges disposed in the area of each of the first to the third touch electrodes to electrically interconnect m touch cathode electrodes in each of the n rows among the m×n touch cathode electrodes. The second touch line may be electrically connected to each of n–k touch bridges and not to the remaining k touch bridges among the n touch bridges disposed in the area of the second touch electrode, k being an even number greater than 0 and less than n/2.

20 Claims, 24 Drawing Sheets

TRANSPARENT TOUCH DISPLAY DEVICE

This application claims the benefit of and priority to Korean Patent Application No. 10-2022-0185649, filed on Dec. 27, 2022, which is hereby incorporated by reference as if fully set forth herein.

BACKGROUND

Technical Field

The present disclosure relates to a touch display device, and particularly but not limited to a transparent touch display device capable of compensating for temperature ghost touch.

Discussion of the Related Art

Among various display devices, a touch display device provides a touch-based input method that allows a user to easily input information or commands in an intuitive and convenient manner, without using a conventional input method, such as a button, a keyboard, or a mouse.

In order to provide such a touch-based input method, the touch display device needs to include a touch sensor structure and a touch sensing circuit for touch sensing. The touch sensor structure of the touch display device may include a plurality of touch electrodes and a plurality of touch lines configured to electrically connect the touch electrodes to the touch sensing circuit, and the touch sensing circuit needs to operate in accordance with the touch sensor structure.

A touch display device, which is configured such that a touch sensor including a plurality of touch electrodes is embedded in a display panel, has been developed in order to reduce the thickness of the touch display device and to improve image quality. Further, there has been an increasing demand for a transparent touch display device that is configured such that self-emitting devices, such as organic light-emitting diodes (OLEDs), are formed on a display panel and is configured to allow light to pass back and forth.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

In a conventional touch and display technology field, a touch display device configured such that a touch sensor is embedded in a display panel has been developed in order to reduce the thickness of the touch display device and to improve image quality. However, where such a touch-sensor-embedded touch display device is not only a self-emitting display device, in which self-emitting devices such as organic light-emitting diodes (OLEDs) are formed on a display panel, but also a transparent display device, which allows light to pass back and forth, it is very difficult to design and manufacture a touch-sensor-embedded display panel due to the self-emitting and transparent characteristics of the display panel. Therefore, the inventors of the present disclosure have developed a transparent touch display device including a touch-sensor-embedded display panel that has an excellent self-emitting performance and high light permeability and is capable of accurately sensing touch.

Accordingly, the present disclosure is directed to a transparent touch display device that substantially obviates one or more issues due to limitations and disadvantages of the related art.

In one aspect of the present disclosure, a transparent touch display device may include: first to third touch electrodes disposed in one column; first to third touch lines disposed across the first to the third touch electrodes to respectively correspond to the first to the third touch electrodes; m×n touch cathode electrodes disposed in n rows and m columns in an area of each of the first to the third touch electrodes (m and n being natural numbers); and n touch bridges disposed in the area of each of the first to the third touch electrodes to electrically interconnect m touch cathode electrodes disposed in each of the n rows among the m×n touch cathode electrodes. The second touch line may be electrically connected to each of the n touch bridges except for k touch bridges among the n touch bridges disposed in the area of the second touch electrode, k being an even number greater than 0 and less than n/2. The second touch line may be electrically connected to k/2 touch bridges among the n touch bridges disposed in the area of the first touch electrode and to k/2 touch bridges among the n touch bridges disposed in the area of the third touch electrode.

In another aspect of the present disclosure, a transparent touch display device may include: first to third touch electrodes disposed in one column; first to third touch lines disposed across the first to the third touch electrodes to respectively correspond to the first to the third touch electrodes; m×n touch cathode electrodes disposed in n rows and m columns in an area of each of the first to the third touch electrodes (m and n being natural numbers); and n touch bridges disposed in the area of each of the first to the third touch electrodes to electrically interconnect m touch cathode electrodes disposed in each of the n rows among the m×n touch cathode electrodes. Within the area of the second touch electrode, the second touch line may be electrically connected to each of n−k touch bridges and not to the remaining k touch bridges among the n touch bridges disposed in the area of the second touch electrode, k being an even number greater than 0 and less than n/2. Among the k touch bridges disposed in the area of the second touch electrode and not electrically connected to the second touch line, k/2 touch bridges may be electrically connected to the first touch line, and the other k/2 touch bridges may be electrically connected to the third touch line.

Embodiments of the present disclosure may provide a transparent touch display device including a touch-sensor-embedded display panel that has an excellent self-emitting performance and high light transmittance and is capable of accurately sensing touch.

Embodiments of the present disclosure may provide a transparent touch display device configured such that a touch sensor is formed at or from a cathode electrode layer through cathode division.

Embodiments of the present disclosure may provide a transparent touch display device configured such that a touch sensor is embedded in a display panel so that the transmittance of the display panel is not affected.

Embodiments of the present disclosure may provide a transparent touch display device capable of reducing the complexity of a process of manufacturing a display panel and reducing the thickness of the display panel.

Embodiments of the present disclosure may provide a transparent touch display device capable of reducing or minimizing the influence of driving of a light-emitting device on touch sensing when the light-emitting device and a touch sensor are disposed in a display panel.

Embodiments of the present disclosure may provide a transparent touch display device capable of reducing or preventing generation of parasitic capacitance in touch lines disposed in a display panel.

Embodiments of the present disclosure may provide a transparent touch display device configured such that, among "n" touch bridges disposed in an area of a certain touch electrode, "k" (k being a multiple of 2 and less than n/2) touch bridges are not connected to a corresponding touch line and are shared by other touch lines, thereby reducing a temperature ghost.

Additional advantages, objects, and features of the present disclosure will be set forth in part in the description which follows and in part will become apparent to those having ordinary skill in the art upon examination of the following description or may be learned from practice of the disclosure. Other objects and advantages of the present disclosure may be realized and attained by the structure particularly pointed out in, or derivable from, the written description, claims hereof, and the appended drawings.

It is to be understood that both the foregoing general description and the following detailed description of the present disclosure are exemplary and explanatory and are intended to provide further explanation of the disclosure as claimed. Other systems, methods, features and advantages will be, or will become, apparent to one with skill in the art upon examination of the following figures and detailed description. It is intended that all such additional systems, methods, features, and advantages be included within this description, be within the scope of the present disclosure, and be protected by the following claims. Nothing in this section should be taken as a limitation on those claims. Further aspects and advantages are discussed below in conjunction with embodiments of the disclosure.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

Figure 1:
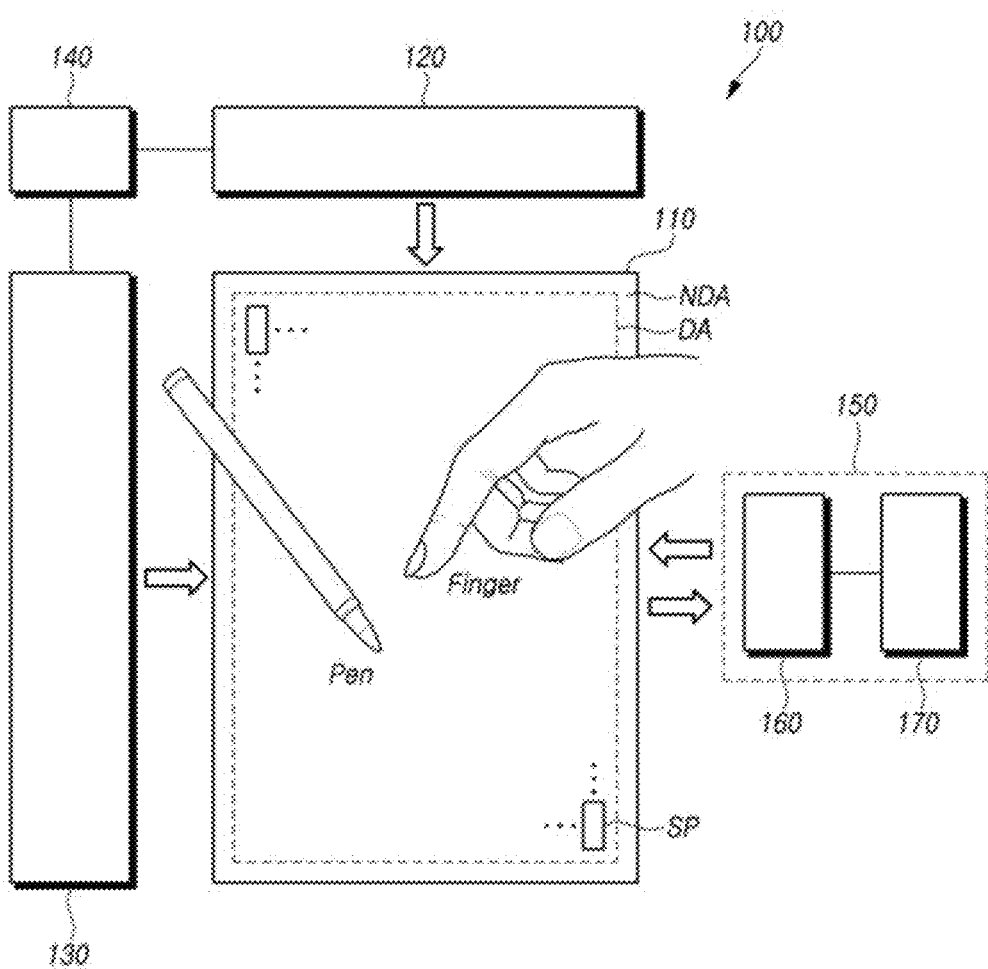
FIG. 1 is a system diagram of a transparent touch display device according to exemplary embodiments of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure and methods for achieving them will be made clear from embodiments described below in detail with reference to the accompanying drawings. The present disclosure may, however, be embodied in many different forms and should not be construed as being limited to the exemplary embodiments set forth herein. Rather, these exemplary embodiments are provided so that this disclosure will be thorough and complete, and will fully convey the scope of the disclosure to those skilled in the art. A protected scope of the present disclosure is defined by the claims and their equivalents.

The shapes, dimensions, areas, lengths, thicknesses, ratios, angles, numbers, and the like, which are illustrated in the drawings to describe various exemplary embodiments of the present disclosure, are merely given by way of example. Therefore, the present disclosure is not limited to such illustrated details of exemplary embodiments in the drawings. Like reference numerals generally denote like elements throughout the specification, unless otherwise specified.

Any implementation described herein as an "example" is not necessarily to be construed as preferred or advantageous over other implementations.

In the following description, where a detailed description of a relevant known function or configuration may unnecessarily obscure aspects of the present disclosure, a detailed description of such a known known function or configuration may be omitted or be briefly discussed.

Where a term like "comprise," "have," "include," "contain," "constitute," "made up of," or "formed of" is used, one or more other elements may be added unless a more limiting term, such as "merely," "only," or the like, is used. An element described in the singular form is intended to include a plurality of elements, and vice versa, unless the context clearly indicates otherwise.

In construing constituent elements, the constituent elements should be construed as including an error or tolerance range even where no explicit description of such an error or tolerance range is provided.

Where a positional relationship between two elements is described, for example, as "on," "above," "below," "under," "beneath," "beside," "adjacent to," and "next," or the like, one or more other elements may be located between the two elements unless a more limiting term, such as "immediately," "direct(ly)" or "close(ly)," is used. For example, where a first element is described as being positioned "on" a second element, the first element may be positioned above and contact the second element or may merely be above the second element with one or more additional elements disposed between the first and second elements.

The terms "first," "second," etc., may be used to distinguish various components. However, functions or structures of the components are not limited by names of the components or ordinal numbers prefixed to the component names. Such terms as "first" and "second" are not used to define a particular essence, order, sequence, precedence, or number of the components. For example, a first element could be termed a second element, and a second element could similarly be termed a first element, without departing from the scope of the present disclosure. With respect to components recited in the claims, ordinal numbers prefixed to names of the components stated in the claims may not match ordinal numbers prefixed to names of the components described in embodiments of the disclosure.

Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" encompasses the combination of all three listed elements, combinations of any two of the three elements, as well as each individual element, the first element, the second element, and the third element.

Features of various embodiments of the present disclosure may be partially or wholly coupled to or combined with each other, and may be operated, linked, or driven together in various ways as those skilled in the art can sufficiently understand. The embodiments of the present disclosure may be carried out independently from each other, or may be carried out together in a co-dependent or related relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, a transparent touch display device according to various example embodiments of the present disclosure will be described in detail with reference to the accompanying drawings.

FIG. 1 is a system diagram of a transparent touch display device 100 according to exemplary embodiments of the present disclosure.

As shown in FIG. 1, the transparent touch display device 100 according to exemplary embodiments of the present disclosure may include a display panel 110 and a display driving circuit as components for displaying an image.

The display driving circuit, as a circuit for driving the display panel 110, may include a data driving circuit 120, a gate driving circuit 130, and a display controller 140.

The display panel 110 may include a display area DA, which is configured to display an image, and a non-display area NDA, which is not configured to display an image. The non-display area NDA may be an area outside (e.g., peripheral to, surrounding or close to) the display area DA and may be referred to as a bezel area.

The display panel 110 may include a plurality of sub-pixels SP. In addition, the display panel 110 may further include various types of signal lines in order to drive the plurality of sub-pixels SP.

The various types of signal lines may include a plurality of data lines configured to transmit data signals (also referred to as data voltages or image signals or video signals) and a plurality of gate lines (also referred to scan lines) configured to transmit gate signals (also referred to as scan signals). The plurality of data lines and the plurality of gate lines may intersect each other, where a sub-pixel may be defined. Each of the plurality of data lines may be disposed so as to extend in a first direction. Each of the plurality of gate lines may be disposed so as to extend in a second direction. Here, the first direction may be a column direction, and the second direction may be a row direction. Alternatively, the first direction may be the row direction, and the second direction may be the column direction. The first direction and the second direction are not necessarily perpendicular to each other.

The transparent touch display device 100 according to exemplary embodiments of the present disclosure may be a liquid crystal display device or may be a self-emitting display device with a display panel 110 configured to emit light by itself. Where the transparent touch display device 100 according to exemplary embodiments of the present disclosure is a self-emitting display device, each of the plurality of sub-pixels SP may include a light-emitting device.

For example, the transparent touch display device 100 according to exemplary embodiments of the present disclosure may be an organic light-emitting display device in which a light-emitting device is implemented as an organic light-emitting diode (OLED). In another example, the transparent touch display device 100 according to exemplary embodiments of the present disclosure may be an inorganic light-emitting display device in which a light-emitting device is implemented as an inorganic material-based light-emitting diode. In still another example, the transparent touch display device 100 according to exemplary embodiments of the present disclosure may be a quantum dot display device in which a light-emitting device is implemented as a quantum dot, which is a self-emissive semiconductor crystal.

The structure of each of the plurality of sub-pixels SP may vary depending on the type of the transparent touch display device 100. For example, where the transparent touch display device 100 is a self-emitting display device in which the sub-pixels SP emit light by themselves, each sub-pixel SP may include a light-emitting device emitting light by itself, one or more transistors, and one or more capacitors. Depending on the number of transistors "x" and the number of capacitors "y", the sub-pixel may be considered to have a "xTyC" structure, such as 3T1C, 4T2C, 7T1C, etc.

The data driving circuit 120 as a circuit for driving the plurality of data lines may output data signals to the plurality of data lines. The gate driving circuit 130 as a circuit for driving the plurality of gate lines may output gate signals to the plurality of gate lines. The display controller 140 as a device for controlling the data driving circuit 120 and the gate driving circuit 130 may control driving timing with respect to the plurality of data lines and driving timing with respect to the plurality of gate lines.

The display controller 140 starts a scanning operation according to timings scheduled in each frame, converts image data inputted from other devices or other image providing sources (e.g., host systems) to a data signal form used in the data driving circuit 120 and then supplies image data DATA resulting from the converting to the data driving circuit 120, and controls the loading of the data to at least one pixel at a pre-configured time according to a scan timing.

The display controller 140 can receive, in addition to input image data, several types of timing signals including a vertical synchronous signal VSYNC, a horizontal synchronous signal HSYNC, an input data enable signal DE, a clock signal CLK, and the like from other devices, networks, or systems (e.g., host systems).

In order to control the data driving circuit 120 and the gate driving circuit 130, the display controller 140 can receive one or more of the timing signals such as the vertical synchronization signal VSYNC, the horizontal synchronization signal HSYNC, the input data enable signal DE, the clock signal CLK, and the like, generate several types of control signals DCS and GCS, and output the generated signals to the data driving circuit 120 and the gate driving circuit 130.

The display controller 140 may supply a data driving control signal to the data driving circuit 120 in order to control the data driving circuit 120 and may supply a gate driving control signal to the gate driving circuit 130 in order to control the gate driving circuit 130.

The data driving circuit 120 may supply data signals to the plurality of data lines in response to driving timing control by the display controller 140. The data driving circuit 120 may receive digital image data from the display controller 140, may convert the received image data into analog data signals, and may output the analog data signals to the plurality of data lines according to the timing at which the scan signal is applied through the gate line GL so that each of the plurality of sub-pixels emits light having brightness according to the data signal.

The gate driving circuit 130 may supply gate signals to the plurality of gate lines GL in response to timing control by the display controller 140. The gate driving circuit 130 may receive a first gate voltage corresponding to a turn-on level voltage and a second gate voltage corresponding to a turn-off level voltage, along with various gate driving control signals (e.g., a start signal and a reset signal), may generate gate signals and may supply the generated gate signals to the plurality of gate lines. By sequentially supplying a gate signal of a turn-on level voltage to the plurality of gate lines GL, the gate driving circuit 130 may sequentially drive the plurality of gate lines GL, thereby controlling the driving timing of the plurality of subpixels SP.

For example, the data driving circuit 120 may be connected to the display panel 110 through a tape-automated bonding (TAB) method, may be connected to a bonding pad of the display panel 110 through a chip-on-glass (COG) or chip-on-panel (COP) method. Alternatively, the data driving circuit 120 may be connected to the display panel 110 through a chip-on-film (COF) method. In this case, the data driving circuit 120 can be mounted on a film connected to the display panel 110, and can be electrically connected to the display panel 110 through wires on the film.

The gate driving circuit 130 may be connected to the display panel 110 through a tape-automated bonding (TAB) method, may be connected to a bonding pad of the display panel 110 through a chip-on-glass (COG) or chip-on-panel (COP) method, or may be connected to the display panel 110 through a chip-on-film (COF) method. Alternatively, the gate driving circuit 130 may be formed in the non-display area NDA of the display panel 110 in a gate-in-panel (GIP) form and disposed directly on the display panel 110. The gate driving circuit 130 may be disposed on or connected to a substrate.

That is, where the gate driving circuit 130 is of a gate-in-panel (GIP) type, the gate driving circuit 130 may be disposed in the non-display area NDA of the substrate. Where the gate driving circuit 130 is of a chip-on-glass (COG) type or a chip-on-panel (COP) type or a chip-on-film (COF) type, the gate driving circuit 130 may be connected to the substrate.

Meanwhile, the driving circuit of at least one of the data driving circuit 120 or the gate driving circuit 130 may be disposed in the display area DA of the display panel 110. For example, the driving circuit of at least one of the data driving circuit 120 or the gate driving circuit 130 may be disposed so as not to overlap the sub-pixels SP, or may be disposed so as to overlap some or all of the sub-pixels SP.

The data driving circuit 120 may be connected to one side (e.g., an upper side or a lower side, or a left side or a right side) of the display panel 110. Depending on the driving scheme or the panel design scheme, the data driving circuit 120 may be connected to both sides (e.g., the upper and lower sides or the left and right sides) of the display panel 110 or may be connected to two or more of the four sides of the display panel 110.

The gate driving circuit 130 may be connected to one side (e.g., a left side or a right side, or an upper side or a lower side) of the display panel 110. Depending on the driving scheme or the panel design scheme, the gate driving circuit 130 may be connected to both sides (e.g., the left and right sides, or an upper side and a lower side) of the display panel 110 or may be connected to two or more of the four sides of the display panel 110.

The display controller 140 may be implemented as a separate component from the data driving circuit 120, or the display controller 140 and the data driving circuit 120 may be integrated into an integrated circuit, or the display controller 140 and the gate driving circuit 130 may be integrated into an integrated circuit.

The display controller 140 may be a timing controller for use in a typical display, a control device that includes a timing controller and may further perform other control functions, a control device other than the timing controller, or a circuit in the control device. The display controller 140 may be implemented as any of various circuits or electronic components, such as an integrated circuit (IC), a field programmable gate array (FPGA), an application specific integrated circuit (ASIC), a digital signal processor (DSP), a digital signal processing device (DSPD), a programmable logic device (PLD), or a processor.

The display controller 140 may be mounted on a printed circuit board, a flexible printed circuit or the like and may be electrically connected to the data driving circuit 120 and the gate driving circuit 130 via the printed circuit board or the flexible printed circuit.

The display controller 140 may transmit/receive signals to/from the data driving circuit 120 according to one or more predetermined interfaces. The interface may include, for example, a low voltage differential signaling (LVDS) interface, an EPI interface, a serial peripheral (SP) interface, a Transition Minimized Differential Signaling (TMDS) interface, and the like.

In order to provide a touch sensing function as well as an image display function, the transparent touch display device 100 according to exemplary embodiments of the present disclosure may include a touch sensor and a touch sensing circuit 150, which may sense the touch sensor to detect whether a touch by a touch object, such as a finger or a pen, occurs or to detect the position of the touch by detecting changes in capacitance from a number of touch electrodes disposed in the display panel.

The touch sensing circuit 150 may include a touch driving circuit 160, which may drive the touch sensor and receive a sensing signal from the touch sensor to generate and output touch sensing data, and a touch controller 170, which may receive sensing data from the touch driving circuit 160 and perform processing according to touch recognition so as to detect the occurrence of a touch or the position of the touch using touch sensing data.

The touch sensor may include a plurality of touch electrodes. The touch sensor may further include a plurality of touch lines to electrically connect the plurality of touch electrodes to the touch driving circuit 160. The touch sensor may be referred to as a touch panel.

In the transparent touch display device 100 according to exemplary embodiments of the present disclosure, the touch sensor may be located in the display panel 110. In this case, the touch sensor is referred to as an internal-type touch sensor or an in-cell touch sensor. The internal-type touch sensor may be formed together with electrodes or signal lines related to driving of the display during a process of manufacturing the display panel 110. Alternatively, the touch sensor and the display panel may be separately manufactured, and then the touch panel is attached on an upper surface of a display device. In this case, the touch sensor is referred to as an add-on type touch sensor.

The touch driving circuit 160 may supply a (e.g., pulse-type) touch driving signal to at least one of the plurality of touch electrodes included in the touch sensor, and may sense at least one of the plurality of touch electrodes to generate touch sensing data.

The touch sensing circuit 150 may perform touch sensing using a self-capacitive sensing scheme or a mutual-capacitive sensing scheme.

Where the touch sensing circuit 150 is configured to perform touch sensing using the self-capacitive sensing scheme, the touch sensing circuit 150 may perform touch sensing based on capacitance between each touch electrode and a touch object (e.g., a finger or a pen). According to the self-capacitive sensing scheme, each of the plurality of touch electrodes may serve both as a driving touch electrode and as a sensing touch electrode. The touch driving circuit 160 may drive all or some of the plurality of touch electrodes and may sense all or some of the plurality of touch electrodes. The self-capacitive touch sensor forms a plurality of independent patterns in a touch area of a touch sensing panel and measures changes in capacitance of each independent pattern, thereby deciding whether or not a touch operation is performed.

Where the touch sensing circuit 150 is configured to perform touch sensing using the mutual-capacitive sensing scheme, the touch sensing circuit 150 may perform touch sensing based on capacitance between the touch electrodes. According to the mutual-capacitive sensing scheme, the plurality of touch electrodes may be divided into driving touch electrodes and sensing touch electrodes. The touch driving circuit 160 may drive the driving touch electrodes and may sense the sensing touch electrodes. The mutual capacitive touch sensor crosses X-axis electrode lines (for example, driving electrode lines) and Y-axis electrode lines (for example, sensing electrode lines) in a touch/common electrode formation area of a touch panel to form a matrix, applies a driving pulse to the X-axis electrode lines, and senses changes in voltages generated in sensing nodes defined as crossings of the X-axis electrode lines and the Y-axis electrode lines through the Y-axis electrode lines, thereby deciding whether or not a touch operation is performed.

As described above, the touch sensing circuit 150 may perform touch sensing using the self-capacitive sensing scheme and/or the mutual-capacitive sensing scheme.

However, for convenience of explanation, a following description will be given on the assumption that the touch sensing circuit 150 performs touch sensing using the self-capacitive sensing scheme.

Each of touch driving circuit 160 and the touch controller 170 may be implemented as an individual integrated circuit. Alternatively, the touch driving circuit 160 and the touch controller 170 may be integrated into a single integrated circuit.

Further, each of the touch driving circuit 160 and the data driving circuit 120 may be implemented as an individual integrated circuit. Alternatively, the touch driving circuit 160 and the data driving circuit 120 may be integrated into a single integrated circuit. For example, where the transparent touch display device 100 includes one driving integrated circuit chip, the driving integrated circuit chip may include the touch driving circuit 160 and the data driving circuit 120. In another example, where the transparent touch display device 100 includes a plurality of driving integrated circuit chips, each of the plurality of driving integrated circuit chips may include a portion of the touch driving circuit 160 and a portion of the data driving circuit 120.

Further, each of the touch driving circuit 160 and the gate driving circuit 130 may be implemented as an individual integrated circuit. Alternatively, the touch driving circuit 160 and the gate driving circuit 130 may be integrated into a single integrated circuit.

The transparent touch display device 100 may further include a power supply circuit configured to supply various powers to the display driving circuit and/or the touch sensing circuit.

The transparent touch display device 100 according to exemplary embodiments of the present disclosure may be a mobile terminal such as a smartphone or a tablet, or may be a computer, a set-top box, a monitor, or a television (TV) having any of various sizes. However, the transparent touch display device 100 is not limited thereto, and may be any of various types of displays that have various sizes and display information or images.

Figure 2:
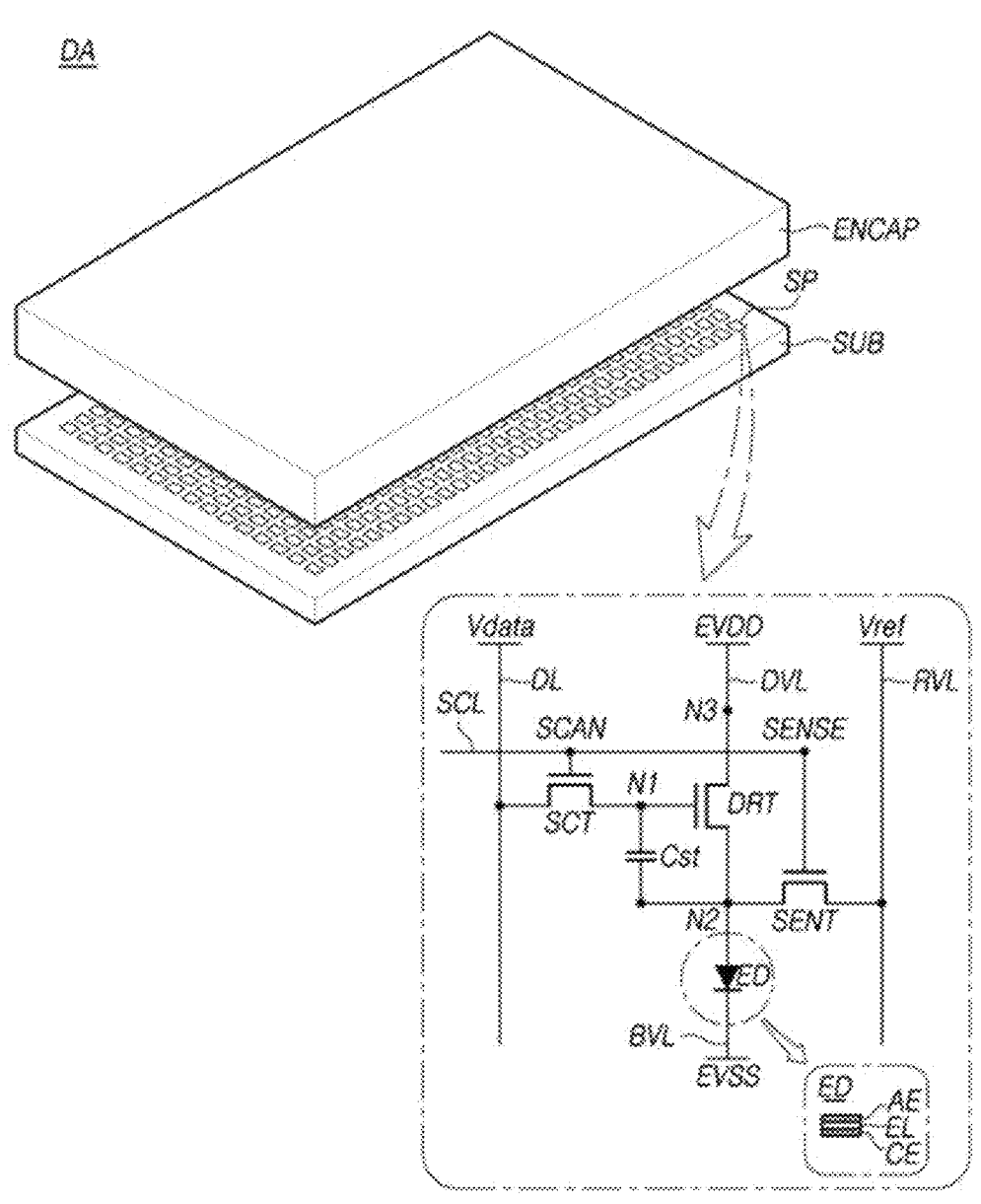
FIG. 2 is a view schematically showing the structure of a display panel of the transparent touch display device according to exemplary embodiments of the present disclosure.

FIG. 2 is a view schematically showing the structure of the display panel 110 of the transparent touch display device 100 according to exemplary embodiments of the present disclosure.

As illustrated in FIG. 2, each of the plurality of sub-pixels SP disposed in the display area DA of the display panel 110 of the transparent touch display device 100 may include a light-emitting device ED, a driving transistor DRT configured to drive the light-emitting device ED, a scan transistor SCT configured to transmit a data voltage Vdata to a first node N1 of the driving transistor DRT, and a storage capacitor Cst configured to maintain a constant voltage during one frame, which may be called a 3T1C structure as mentioned above.

The driving transistor DRT may include the first node N1 to which the data voltage may be applied, a second node N2 electrically connected to the light-emitting device ED, and a third node N3 to which a driving voltage EVDD is applied from a driving voltage line DVL. In the driving transistor DRT, the first node N1 may be a gate node, the second node N2 may be one of a source node and a drain node, and the third node N3 may be the other of the source node and the drain node. Hereinafter, for convenience of explanation, the first node N1 of the driving transistor DRT will be referred to as a gate node or a gate electrode, the second node N2 of the driving transistor DRT will be referred to as a source node or a source electrode, and the third node N3 of the driving transistor DRT will be referred to as a drain node or a drain electrode, but the present disclosure is not limited thereto.

The light-emitting device ED may include an anode electrode AE, an emission layer EL, and a cathode electrode CE. The anode electrode AE of the light-emitting device ED may be electrically connected to the second node N2 of the driving transistor DRT of each of the sub-pixels SP. The cathode electrode CE of the light-emitting device ED may be electrically connected to a base voltage line BVL to which a base voltage EVSS is applied.

For example, the anode electrode AE may be a pixel electrode disposed in each sub-pixel SP, and the cathode electrode CE may be a common electrode to which the base voltage EVSS is applied. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise. The base voltage EVSS may be a type of common voltage supplied for driving all of the sub-pixels SP.

For example, the light-emitting device ED may be an organic light-emitting diode (OLED), an inorganic light-emitting diode, or a quantum dot light-emitting diode. Where the light-emitting device ED is an organic light-emitting diode (OLED), the emission layer EL of the light-emitting device ED may include an organic emission layer including an organic material. For example, the emission layer EL may include one or more of a hole injection layer (HIL), a hole transmitting layer (HTL), an electron transmitting layer (ETL) and an electron injection layer (EIL), but the present disclosure is not limited thereto.

The scan transistor SCT may be controlled to be on/off in response to a scan signal SCAN, which is a gate signal applied through the scan signal line SCL, and may be electrically connected between the first node N1 of the driving transistor DRT and the data line DL.

The storage capacitor Cst may be connected between the first node N1 and the second node N2 of the driving transistor DRT.

As shown in FIG. 2, each of the plurality of sub-pixels SP disposed in the display area DA of the display panel 110 of the transparent touch display device 100 may include at least a light-emitting device ED, two transistors DRT and SCT, and one capacitor Cst, and in some cases, may further include more than two transistors, or further include more than one capacitors.

Each of the plurality of sub-pixels SP disposed in the display area DA of the display panel 110 of the transparent touch display device 100 may further include one or more additional transistors or may further include one or more additional capacitors.

For example, as shown in FIG. 2, each sub-pixel SP may further include a sensing transistor SENT configured to control a connection between the second node N2 of the driving transistor DRT and a reference voltage line RVL. Here, the reference voltage line RVL may be a signal line for supplying a reference voltage Vref to the sub-pixel SP.

The reference voltage line RVL may be disposed for one sub-pixel column. Alternatively, the reference voltage line RVL may be disposed for two or more sub-pixel columns. When the reference voltage line RVL is disposed for two or more sub-pixel columns, the plurality of sub-pixels SP may receive the reference voltage Vref from one reference voltage line RVL. For example, one reference voltage line RVL may be disposed for four sub-pixel columns. That is, one reference voltage line RVL may be shared by the sub-pixels SP included in the four sub-pixel columns.

As shown in FIG. 2, the gate node of the sensing transistor SENT may be electrically connected to the gate node of the scan transistor SCT. That is, the scan signal line SCL electrically connected to the gate node of the scan transistor SCT may also be electrically connected to the gate node of the sensing transistor SENT.

Alternatively, the gate node of the sensing transistor SENT may be electrically connected to a sensing signal line other than the scan signal line SCL connected to the gate node of the scan transistor SCT.

The storage capacitor Cst may be an external capacitor intentionally designed so as to be disposed outside the driving transistor DRT, rather than being a parasitic capacitor (e.g., Cgs or Cgd), which is an internal capacitor that may be formed between the first node N1 and the second node N2 of the driving transistor DRT.

Each of the driving transistor DRT, the scan transistor SCT, and the sensing transistor SENT may be an n-type transistor or a p-type transistor depending on design requirements.

Because the circuit devices (particularly, the light-emitting devices ED) in the sub-pixels SP are vulnerable to foreign matters such as external moisture or oxygen, the display panel 110 may include an encapsulation layer ENCAP in order to prevent foreign matters such as external moisture or oxygen from entering the circuit devices (particularly, the light-emitting devices ED).

The encapsulation layer ENCAP may be formed in any of various types.

For example, the encapsulation layer ENCAP may be disposed so as to cover the light-emitting devices ED. The encapsulation layer ENCAP may include one or more inorganic layers and one or more organic layers. An inorganic layer may include an inorganic insulating material, for example, capable of low-temperature deposition, such as silicon nitride (SiNx), silicon oxide (SiOx), silicon oxynitride (SiOxNy) and aluminum oxide (Al$_2$O$_3$). An organic encapsulating layer may include an organic insulating material, such as acrylic resin, epoxy resin, polyimide, polyethylene, and silicon oxycarbide (SiOC).

In another example, the encapsulation layer ENCAP may include an encapsulation substrate, a dam disposed between the thin-film transistor array substrate and the encapsulation substrate along the outer edge of the display area DA, and a filler charged in the inner space partially or wholly bounded or surrounded by the dam. The encapsulation substrate may protect the TFT and emission layer from an external impact and may prevent foreign matters such as water or oxygen from penetrating into the emission layer.

Figure 3:
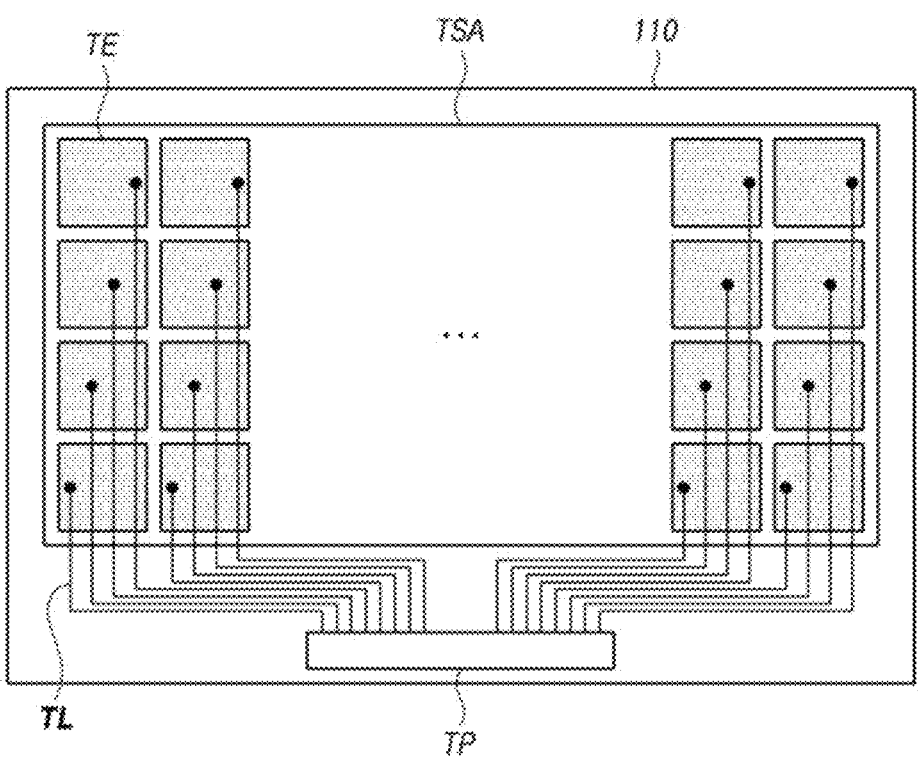
FIG. 3 is a view schematically showing the structure of a touch sensor of the transparent touch display device according to exemplary embodiments of the present disclosure.

FIG. 3 is a view schematically showing the structure of a touch sensor of the transparent touch display device 100 according to exemplary embodiments of the present disclosure.

As shown in FIG. 3, the transparent touch display device 100 according to exemplary embodiments of the present disclosure may include a touch sensor disposed in the touch sensing area TSA of the display panel 110.

The touch sensor included in the transparent touch display device 100 according to exemplary embodiments of the present disclosure may include a plurality of touch electrodes TE disposed in the touch sensing area TSA The touch sensor may be formed on an organic thin film on which pixel arrays are formed.

The touch sensor included in the transparent touch display device 100 according to exemplary embodiments of the present disclosure may further include a plurality of touch lines TL to electrically connect the plurality of touch electrodes TE to a plurality of touch pads TP, to which the touch driving circuit 160 may be electrically connected. Here, the plurality of touch lines TL may be referred to as a plurality of touch routing lines.

Where the touch sensor included in the transparent touch display device 100 according to exemplary embodiments of the present disclosure is of a self-capacitive sensing type, the plurality of touch electrodes TE does not electrically overlap or cross each other. In the self-capacitive touch sensor, each of the plurality of touch electrodes TE may constitute one touch node corresponding to a touch coordinate.

Where the transparent touch display device 100 according to exemplary embodiments of the present disclosure senses a touch based on self-capacitance, the touch driving circuit 160 may supply a touch driving signal to at least one of the plurality of touch electrodes TE, and may receive a sensing signal from a touch electrode TE to which the touch driving signal is supplied.

Each of the plurality of touch electrodes TE may be an electrode having no opening or may constitute a mesh-type electrode pattern having a plurality of openings formed therein. Further, each of the plurality of touch electrodes TE may include a transparent electrode.

The sensing signal for the touch electrode TE to which the touch driving signal is supplied may have a value corresponding to a capacitance or a change in the capacitance in the touch electrode TE to which the touch driving signal is supplied. The capacitance in the touch electrode TE to which the touch driving signal is supplied may be a capacitance between the touch electrode TE to which the touch driving signal is supplied and a touch pointer, such as a finger, pen, or the like.

As described above, in the transparent touch display device 100 according to exemplary embodiments of the present disclosure, the touch sensor including the plurality of touch electrodes TE may be embedded in the display panel 110. Therefore, during a process of manufacturing the display panel 110, touch bridges, the touch electrodes TE and the touch lines TL may also be formed when electrodes, lines, patterns and the like related to display driving of the display device are formed.

Figure 4:
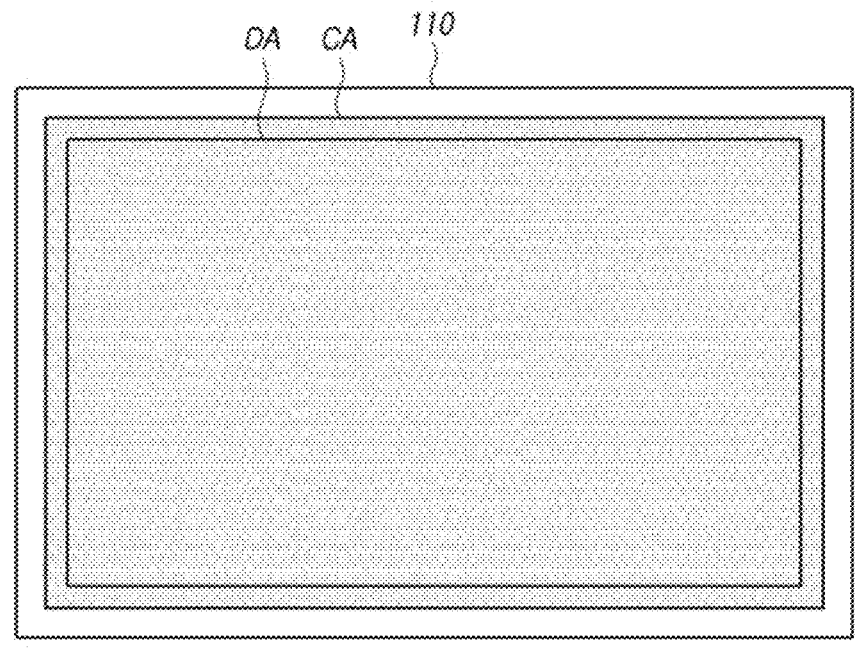
FIG. 4 is a plan view of the display panel of the transparent touch display device according to exemplary embodiments of the present disclosure.

FIG. 4 is a plan view of the display panel 110 of the transparent touch display device 100 according to exemplary embodiments of the present disclosure.

As illustrated in FIG. 4, the display panel 110 of the transparent touch display device 100 according to exemplary embodiments of the present disclosure may include a cathode electrode area CA, which overlaps the display area DA and in which the cathode electrode CE may be disposed.

The cathode electrode area CA may have the same or similar area (size) as the display area DA. In this case, the cathode electrode area CA may completely overlap the display area DA. Alternatively, as shown in FIG. 4, the cathode electrode area CA may have a larger area (size) than the display area DA. In this case, the cathode electrode area CA may include an area that completely overlaps the display area DA and an area that overlaps the non-display area NDA.

In the transparent touch display device 100 according to exemplary embodiments of the present disclosure, the cathode electrode CE, to which the base voltage EVSS is applied, may be referred to as a display cathode electrode.

The transparent touch display device 100 according to exemplary embodiments of the present disclosure may include one or more display cathode electrodes, and one or more touch cathode electrodes may also be disposed at a cathode electrode layer at which one or more display cathode electrodes are disposed.

That is, the transparent touch display device 100 according to exemplary embodiments of the present disclosure may include one or more display cathode electrodes and one or more touch cathode electrodes. The one or more display cathode electrodes and the one or more touch cathode electrodes may be disposed together in the cathode electrode area CA and may be located together at the cathode electrode layer. Alternatively, the one or more display cathode electrodes and the one or more touch cathode electrodes may be disposed in different areas or may be located at different layers.

In the transparent touch display device 100 according to exemplary embodiments of the present disclosure, the one or more display cathode electrodes and the one or more touch cathode electrodes need to be electrically separated from each other.

In the transparent touch display device 100 according to exemplary embodiments of the present disclosure, the one or more display cathode electrodes may be cathode electrodes CE of the light-emitting devices ED of the plurality of sub-pixels SP, and the base voltage EVSS may be applied thereto.

In the transparent touch display device 100 according to exemplary embodiments of the present disclosure, the one or more touch cathode electrodes may serve as a touch sensor.

In the transparent touch display device 100 according to exemplary embodiments of the present disclosure, a cathode division structure is of a type in which the cathode electrode layer is divided into one display cathode electrode and a plurality of touch cathode electrodes.

Figure 5:
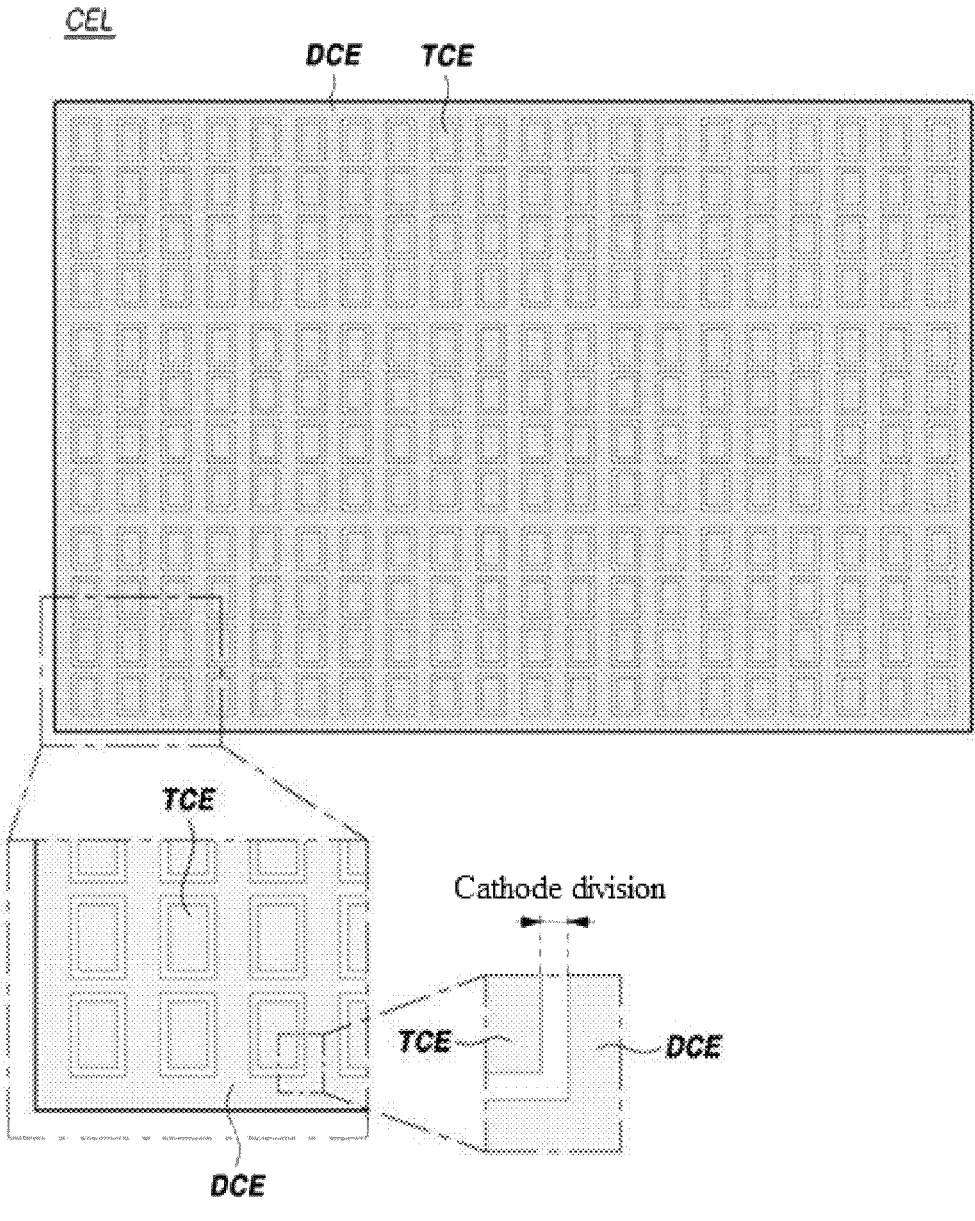
FIG. 5 is a view showing a cathode division structure of the display panel of the transparent touch display device according to exemplary embodiments of the present disclosure.

FIG. 5 is a view showing the cathode division structure of the display panel 110 of the transparent touch display device 100 according to exemplary embodiments of the present disclosure.

As illustrated in FIG. 5, the display panel 110 of the transparent touch display device 100 according to exemplary embodiments of the present disclosure may be configured such that one display cathode electrode DCE and a plurality of touch cathode electrodes TCE are disposed at the cathode electrode layer CEL. That is, the one display cathode electrode DCE and the plurality of touch cathode electrodes TCE may be formed of the same material and/or from the same layer. Alternatively, the display panel 110 of the transparent touch display device 100 according to exemplary embodiments of the present disclosure may be configured such that a plurality of display cathode electrodes DCE and a plurality of touch cathode electrodes TCE are disposed at the cathode electrode layer CEL. But the present disclosure is not limited thereto.

A lower layer located under the cathode electrode layer CEL may have an under-cut shape in which a lower portion of the lower layer is depressed inwards. Accordingly, when a cathode electrode material is deposited on the lower layer, the cathode electrode material may be divided into separate parts at the under-cut point of the lower layer. The cathode electrode material parts separated at the under-cut point of the lower layer may correspond to the display cathode electrode DCE and the touch cathode electrodes TCE. The lower layer to which the under-cut may be applied may include, for example, a pixel electrode layer on which the anode electrode AE is formed, an overcoat layer, or a bank, without being limited thereto.

The one display cathode electrode DCE may correspond to the cathode electrodes CE of the light-emitting devices ED of the plurality of sub-pixels SP, and the base voltage EVSS may be applied to the one display cathode electrode DCE.

The plurality of touch cathode electrodes TCE may be spaced apart from each other. The plurality of touch cathode electrodes TCE may be disposed adjacent to the one display cathode electrode DCE. However, the plurality of touch cathode electrodes TCE may be spaced apart from the one display cathode electrode DCE. The plurality of touch cathode electrodes TCE may be electrically separated from the one display cathode electrode DCE.

As shown in FIG. 5, where the transparent touch display device 100 according to exemplary embodiments of the present disclosure has a first type of cathode division structure, the one display cathode electrode DCE may include a plurality of openings. The plurality of touch cathode electrodes TCE may be located in an island shape respectively in the inner spaces in the plurality of openings formed in the one display cathode electrode DCE. Alternatively, the transparent touch display device 100 according to exemplary embodiments of the present disclosure may have another type of cathode division structure in which the touch cathode electrodes TCE and the display cathode electrodes DCE are disposed in a line shape or stripe shape having the same or similar size or different sizes.

As illustrated in FIG. 5, a display cathode electrode DCE, which is one type of a display driving electrode, or a portion thereof may be disposed between two adjacent ones among the plurality of touch cathode electrodes TCE.

As shown in FIG. 5, one or more sub-pixels SP or emission areas thereof may be disposed between two adjacent ones among the plurality of touch cathode electrodes TCE.

The area (size) of each of the plurality of touch cathode electrodes TCE may be equal to the area (size) of one sub-pixel SP or a region thereof.

Alternatively, the area (size) of each of the plurality of touch cathode electrodes TCE may be larger than the area (size) of one sub-pixel SP or a region thereof. For example, the area (size) of each of the plurality of touch cathode electrodes TCE may correspond to the areas (or sizes) of two or more sub-pixels SP or regions thereof.

Figure 6A:
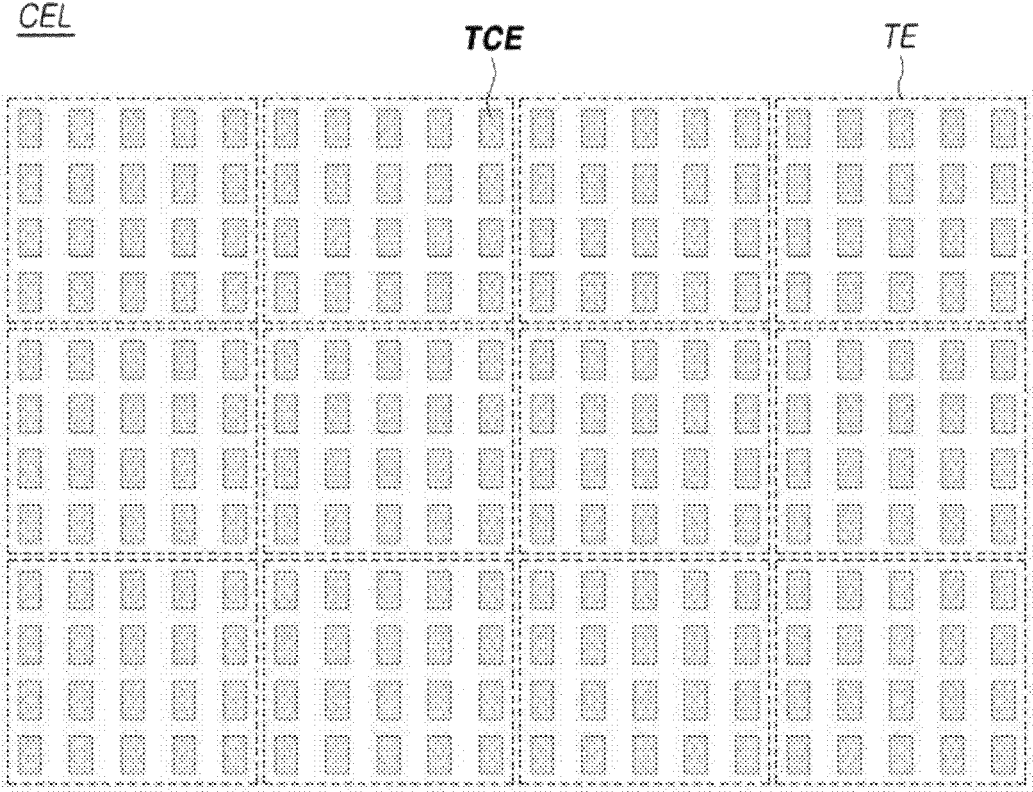
FIGS. 6A, 6B, and 6C are views showing a touch sensor structure where the display panel of the transparent touch display device according to exemplary embodiments of the present disclosure has the cathode division structure.
Figure 6B:
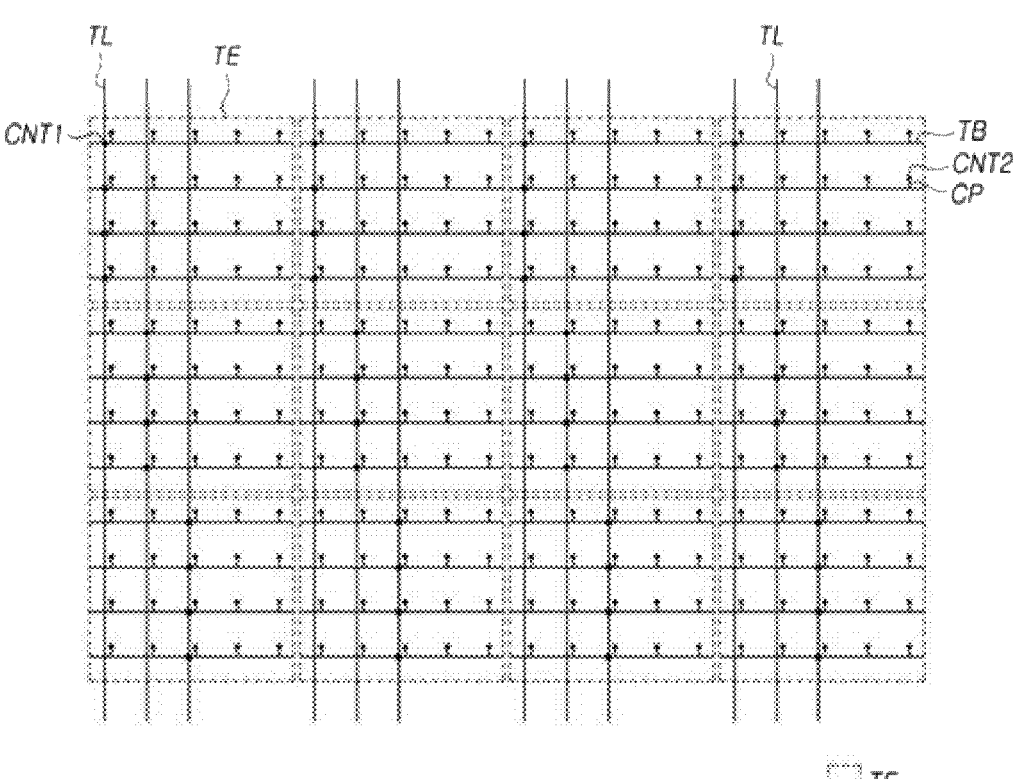
Figure 6C:
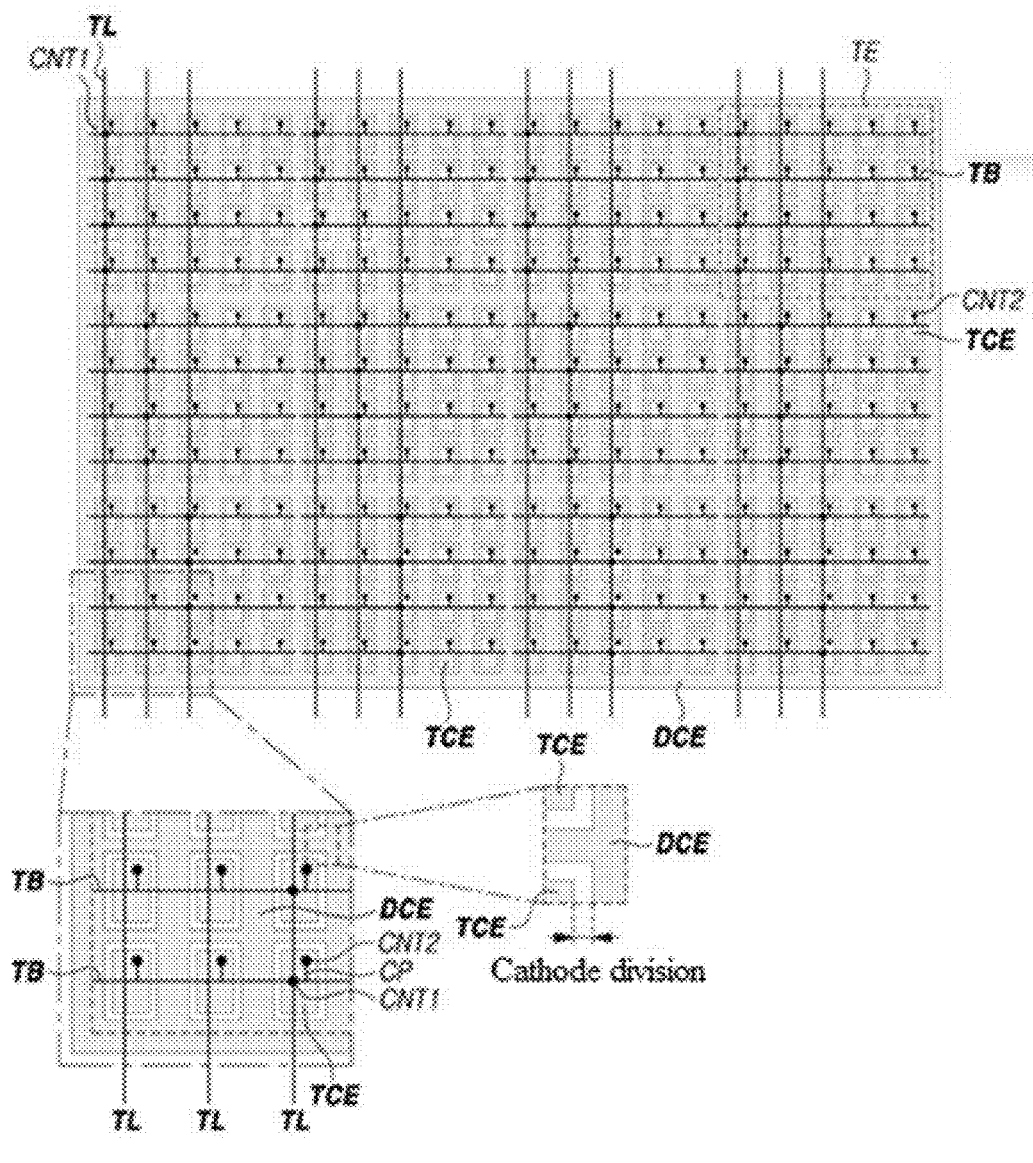

FIGS. 6A, 6B, and 6C are views showing a touch sensor structure where the display panel 110 of the transparent touch display device 100 according to exemplary embodiments of the present disclosure has the cathode division structure described with reference to FIG. 5. However, for convenience of explanation, in FIG. 6A, the display cathode electrode DCE is not illustrated, and only the plurality of touch cathode electrodes TCE is shown.

As shown in FIG. 6A, the plurality of touch cathode electrodes TCE may be grouped into a plurality of groups. Here, the plurality of groups may be a plurality of touch electrodes TE. In other words, the transparent touch display device 100 according to exemplary embodiments of the present disclosure may include a plurality of touch electrodes TE, and each of the plurality of touch electrodes TE may include two or more touch cathode electrodes TCE.

According to the example shown in FIG. 6A, the display panel 110 may include 12 touch electrodes TE arranged in 3 rows and 4 columns, and one touch electrode TE may include 20 touch cathode electrodes TCE arranged in 4 rows and 5 columns. The number of rows, columns, touch electrodes and touch cathode electrodes are not limited to above examples, and may be any integer larger than one. This example will be described below in detail.

In order to realize normal touch sensing operation, the twenty touch cathode electrodes TCE within one touch electrode TE may be electrically connected to each other to operate as one touch electrode TE.

Further, in order to realize normal touch sensing operation, the plurality of touch electrodes TE may be electrically separated from each other within the display panel 110. In some cases, some of the plurality of touch electrodes TE may be electrically connected to each other within the touch driving circuit 160. This may be used for group driving operation (or group sensing operation) for simultaneously sensing two or more touch electrodes TE.

As described above, in order to realize normal touch sensing operation, the plurality of touch electrodes TE may be electrically separated from each other within the display panel 110, and each of the plurality of touch electrodes TE may be electrically connected to the touch driving circuit 160.

Describing again this example connection structure from the point of view of the touch cathode electrodes TCE, two or more touch cathode electrodes TCE disposed in the region of one touch electrode TE are electrically connected to each other. Two or more touch cathode electrodes TCE disposed in the region of one touch electrode TE and two or more touch cathode electrodes TCE disposed in the region of another touch electrode TE are electrically separated from each other. In addition, two or more touch cathode electrodes TCE disposed in the region of each touch electrode TE are electrically connected to the touch driving circuit 160.

FIG. 6B shows only additional connection structures TL, TB, CP, CNT1, and CNT2 disposed in the cathode electrode area CA in order to form a touch sensor structure. However, for convenience of explanation, the cathode electrode layer CEL is not illustrated in FIG. 6B. FIG. 6C is a plan view showing both the cathode electrode layer CEL shown in FIG. 5 and the connection structures TL, TB, CP, CNT1, and CNT2 shown in FIG. 6B.

As shown in FIGS. 6B and 6C, in order to form a touch sensor structure according to the aforementioned connection structure, the display panel 110 may include a plurality of touch lines TL and a plurality of touch bridges TB.

As illustrated in FIGS. 6B and 6C, the plurality of touch lines TL may respectively correspond to the plurality of touch electrodes TE. The plurality of touch electrodes TE may be connected to the touch driving circuit 160 via the plurality of touch lines TL.

As shown in FIGS. 6B and 6C, at least one touch bridge TB may be disposed in the region of each of the plurality of touch electrodes TE. That is, at least one touch bridge TB may be disposed in the region of one touch electrode TE.

The touch sensor structure of one touch electrode TE will be described with reference to the example shown in FIGS. 6B and 6C.

With reference to the example shown in FIGS. 6B and 6C, one touch electrode TE may be composed of twenty touch cathode electrodes TCE, and the twenty touch cathode electrodes TCE may be arranged in 4 rows and 5 columns. That is, one touch electrode TE may include first to fourth touch cathode electrode rows, and each of the first to fourth touch cathode electrode rows may include five touch cathode electrodes TCE. The numbers of rows and columns are not limited to above example, and may be any integer larger than one.

With reference to the example shown in FIGS. 6B and 6C, four touch bridges TB may be disposed in the region of one touch electrode TE. The four touch bridges TB may respectively correspond to the first to fourth touch cathode electrode rows. The five touch cathode electrodes TCE included in each of the first to fourth touch cathode electrode rows may be electrically connected to each other via one touch bridge TB.

With reference to the example shown in FIGS. 6B and 6C, the plurality of touch lines TL may be disposed across the region in which one touch electrode TE is formed. One of the plurality of touch lines TL may be electrically connected to the first to fourth touch cathode electrode rows through four first contact holes CNT1.

With reference to the example shown in FIGS. 6B and 6C, each of the four touch bridges TB disposed in the region of one touch electrode TE may correspond to five protrusion-type connection patterns CP. One touch bridge TB may be electrically connected to five touch cathode electrodes TCE via five protrusion-type connection patterns CP.

As shown in FIGS. 6B and 6C, five protrusion-type connection patterns CP of one touch bridge TB may be respectively connected to five touch cathode electrodes TCE through five second contact holes CNT2.

As illustrated in FIGS. 6B and 6C, the first contact hole CNT1 may be a point connecting the touch line TL to the touch bridge TB, and the second contact hole CNT2 may be a point connecting the touch bridge TB to the touch cathode electrode TCE. All of the twenty touch cathode electrodes TCE in a touch electrode TE may be electrically connected to one touch line TL through four first contact holes CNT1 and twenty second contact holes CNT2.

Where the transparent touch display device 100 according to exemplary embodiments of the present disclosure has the cathode division structure described with reference to FIG. 5, one display cathode electrode DCE may be used for driving of the display, and thus, the base voltage EVSS, which is a type of common voltage, may be uniformly supplied to all of the sub-pixels SP. Accordingly, image quality may be improved.

Figure 7:
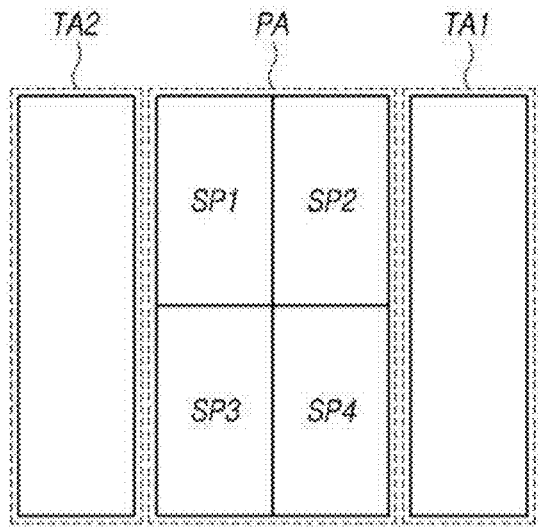
FIG. 7 is a view showing a pixel area and transmissive areas in a portion of the display panel of the transparent touch display device according to exemplary embodiments of the present disclosure.

FIG. 7 is a view showing a pixel area PA and transmissive areas TA1 and TA2 in a portion of the display panel 110 of the transparent touch display device 100 according to exemplary embodiments of the present disclosure.

As shown in FIG. 7, a portion of the display panel 110 of the transparent touch display device 100 according to exemplary embodiments of the present disclosure may include a pixel area PA, a first transmissive area TA1, and a second transmissive area TA2.

As illustrated in FIG. 7, the first transmissive area TA1 may be located on a first side of the pixel area PA, and the second transmissive area TA2 may be located on a second side of the pixel area PA.

As shown in FIG. 7, two or more sub-pixels SP1, SP2, SP3, and SP4 may be disposed in the pixel area PA between the first transmissive area TA1 and the second transmissive area TA2.

According to the example shown in FIG. 7, four sub-pixels SP1, SP2, SP3, and SP4 may be disposed in the pixel area PA between the first transmissive area TA1 and the second transmissive area TA2. The four sub-pixels SP1, SP2, SP3, and SP4 may include a sub-pixel emitting red light, a sub-pixel emitting green light, a sub-pixel emitting blue light, and a sub-pixel emitting white light. Color of light emitted by sub-pixels is not limited thereto, and can be any color such as cyan, magenta, yellow, black, etc.

Figure 8:
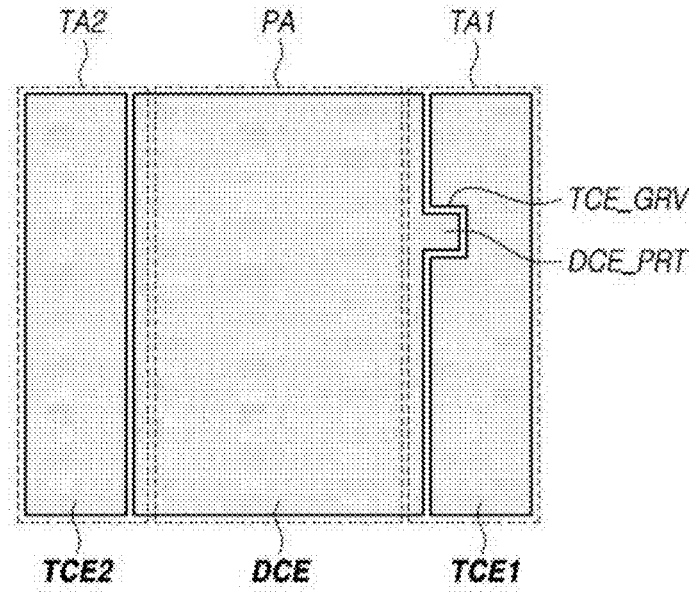
FIG. 8 is a view showing a display cathode electrode and touch cathode electrodes respectively disposed in the pixel area and the transmissive areas in a portion of the display panel of the transparent touch display device according to exemplary embodiments of the present disclosure.

FIG. 8 is a view showing a display cathode electrode DCE and touch cathode electrodes TCE1 and TCE2 respectively disposed in the pixel area PA and the transmissive areas TA1 and TA2 in a portion of the display panel 110 of the transparent touch display device 100 according to exemplary embodiments of the present disclosure.

As illustrated in FIG. 8, a display cathode electrode DCE to which the base voltage EVSS for driving of the display is applied may be disposed in the pixel area PA. A first touch cathode electrode TCE1 may be disposed in the first transmissive area TA1, and a second touch cathode electrode TCE2 may be disposed in the second transmissive area TA2.

The first touch cathode electrode TCE1 and the second touch cathode electrode TCE2 may have the same or similar shape or the same or similar area.

One of the first touch cathode electrode TCE1 and the second touch cathode electrode TCE2 may have a different shape or area from the remaining one.

As shown in FIG. 8, in an exemplary embodiment, the display cathode electrode DCE may include an electrode protrusion DCE_PRT. In this case, the first touch cathode electrode TCE1 may include an electrode groove TCE_GRV in which the electrode protrusion DCE_PRT of the display cathode electrode DCE is disposed.

The electrode protrusion DCE_PRT of the display cathode electrode DCE and the electrode groove TCE_GRV in the first touch cathode electrode TCE1 may be electrically separated from each other.

The electrode protrusion DCE_PRT of the display cathode electrode DCE may protrude into the first transmissive area TA1.

In the example illustrated in FIG. 8, a first side portion of the display cathode electrode DCE may protrude into a portion of the first transmissive area TA1. Although not illustrated, a second side portion of the display cathode electrode DCE may protrude into a portion of the second transmissive area TA2.

Figure 9:
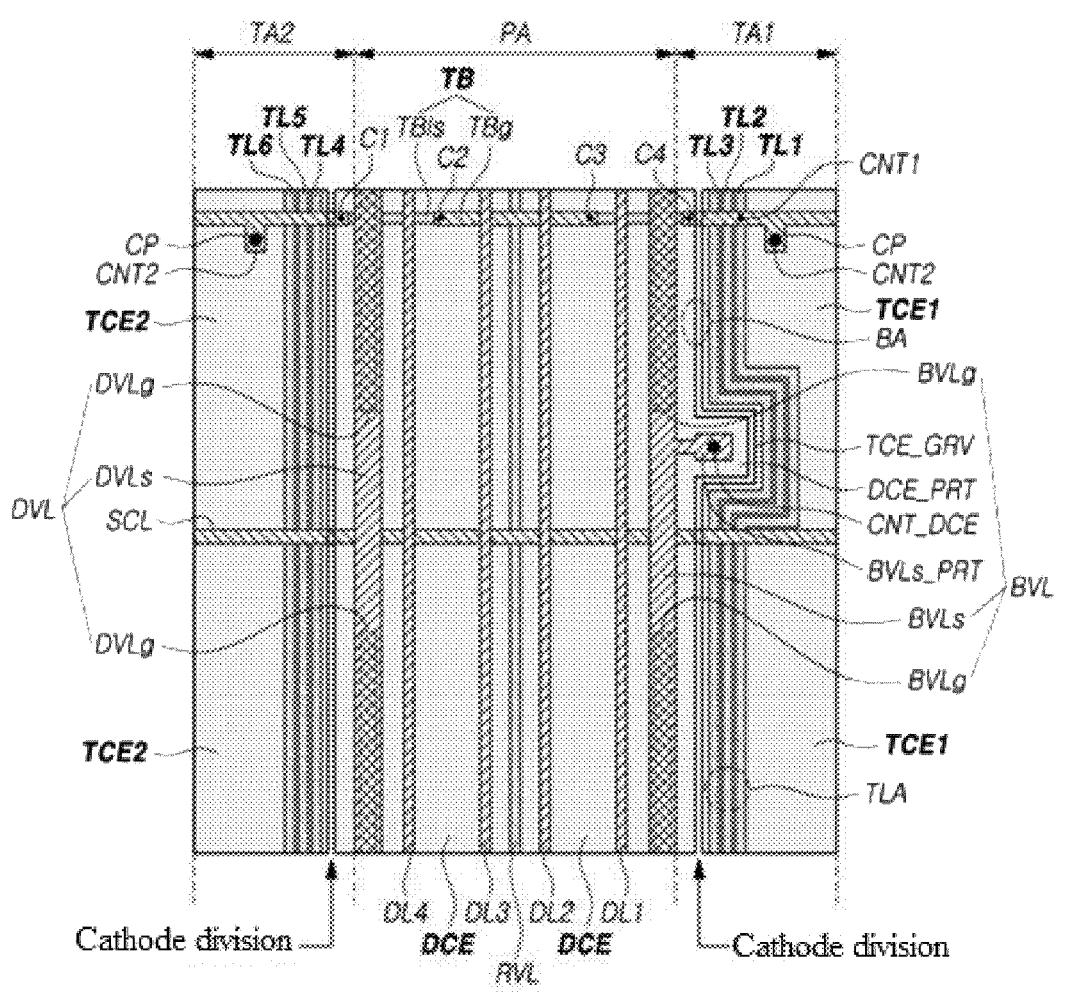
FIG. 9 is a plan view of the display panel of the transparent touch display device according to exemplary embodiments of the present disclosure.

FIG. 9 is a plan view of the display panel 110 of the transparent touch display device 100 according to exemplary embodiments of the present disclosure.

As shown in FIG. 9, the display panel 110 of the transparent touch display device 100 according to exemplary embodiments of the present disclosure may include a display cathode electrode DCE disposed in the pixel area PA, a first touch cathode electrode TCE1 disposed in the first transmissive area TA1, and a second touch cathode electrode TCE2 disposed in the second transmissive area TA2.

In the example illustrated in FIG. 9, a first side portion of the display cathode electrode DCE may protrude into a portion of the first transmissive area TA1. Although not illustrated, a second side portion of the display cathode electrode DCE may protrude into a portion of the second transmissive area TA2.

As shown in FIG. 9, the display panel 110 of the transparent touch display device 100 according to exemplary embodiments of the present disclosure may further include a plurality of touch lines TL1, TL2, and TL3 overlapping the first touch cathode electrode TCE1 and a plurality of touch lines TL4, TL5, and TL6 overlapping the second touch cathode electrode TCE2. The number and position of touch lines included overlapping the first and second touch cathode electrodes are not limited to those of TL1, TL2, TL3, TL4, TL5, and TL6 illustrated in FIG. 9, and can be any number and any position as necessary.

In the example illustrated in FIG. 9, the first touch cathode electrode TCE1 and the second touch cathode electrode TCE2 may constitute one first touch electrode TE to which touch driving signals are simultaneously applied.

In the example shown in FIG. 9, the one first touch electrode TE may be electrically connected to the touch pad TP via one first touch line TL1 among the plurality of touch lines TL1, TL2, and TL3 overlapping the first touch cathode electrode TCE1. That is, the first touch cathode electrode TCE1 and the second touch cathode electrode TCE2 may be electrically connected to the touch pad TP via one first touch line TL1 among the plurality of touch lines TL1, TL2, and TL3 overlapping the first touch cathode electrode TCE1. The present disclosure is not limited thereto, and the one first touch electrode TE may be electrically connected to the touch pad TP via any one of touch lines TL1, TL2, TL3, TL4, TL5, and TL6.

As shown in FIG. 9, among the plurality of touch lines TL1, TL2, and TL3 overlapping the first touch cathode electrode TCE1, the remaining touch lines TL2 and TL3 except for the first touch line TL1 may not be electrically connected to the first touch cathode electrode TCE1, but may be electrically connected to another touch cathode electrode TCE that is electrically separated from the first touch cathode electrode TCE1 and the second touch cathode electrode TCE2.

As illustrated in FIG. 9, all of the plurality of touch lines TL4, TL5, and TL6 overlapping the second touch cathode electrode TCE2 may not be electrically connected to the second touch cathode electrode TCE2 and the first touch cathode electrode TCE1, but may be electrically connected to another touch cathode electrode TCE that is electrically separated from the first touch cathode electrode TCE1 and the second touch cathode electrode TCE2.

The display cathode electrode DCE, the first touch cathode electrode TCE1, and the second touch cathode electrode TCE2 may be cathode electrode material parts separated by an under-cut portion of a lower layer located under the cathode electrode layer CEL. Therefore, the display cathode electrode DCE, the first touch cathode electrode TCE1, and the second touch cathode electrode TCE2 may have or be formed from the same cathode electrode material. The cathode electrode material may include, for example, a transparent conductive material. For example, the transparent conductive material may include indium tin oxide (ITO) or indium zinc oxide (IZO), but embodiments of the present disclosure are not limited thereto. The opaque conductive material may include aluminum (Al), copper (Cu), gold (Au), silver (Ag), molybdenum (Mo), a magnesium (Mg), or the like, or an alloy thereof, but embodiments of the present disclosure are not limited thereto.

As shown in FIG. 9, the first touch line TL1 may be electrically connected to the first touch cathode electrode TCE1 and the second touch cathode electrode TCE2.

For example, the first touch line TL1 may be electrically connected to the first touch cathode electrode TCE1 via the first touch bridge TB. In detail, the first touch line TL1 may be electrically connected to the first touch bridge TB through the first contact hole CNT1, and the protrusion-type connection pattern CP of the first touch bridge TB may be electrically connected to the first touch cathode electrode TCE1 through the second contact hole CNT2, whereby the first touch line TL1 may be electrically connected to the first touch cathode electrode TCE1 via the first touch bridge TB.

Where the transparent touch display device 100 according to exemplary embodiments of the present disclosure has the cathode division structure described with reference to FIG. 5, the display cathode electrode DCE may include a plurality of openings, the first touch cathode electrode TCE1 may be disposed in the inner space in a first opening among the plurality of openings in the display cathode electrode DCE, and the second touch cathode electrode TCE2 may be disposed in the inner space in a second opening among the plurality of openings in the display cathode electrode DCE.

As illustrated in FIG. 9, the display panel 110 of the transparent touch display device 100 according to exemplary embodiments of the present disclosure may further include a first scan signal line SCL disposed across the first transmissive area TA1, the pixel area PA, and the second transmissive area TA2.

As shown in FIG. 9, the display panel 110 of the transparent touch display device 100 according to exemplary embodiments of the present disclosure may further include a first touch bridge TB disposed across the pixel area PA to electrically interconnect the first touch cathode electrode TCE1 and the second touch cathode electrode TCE2.

As shown in FIG. 9, in the display panel 110 of the transparent touch display device 100 according to exemplary embodiments of the present disclosure, the first touch bridge TB may cross the first touch line TL1, and the first touch line TL1 may be electrically connected to the first touch bridge TB through the first contact hole CNT1. The present disclosure is not limited thereto, and the first touch bridge TB may cross any one of touch lines TL1, TL2, TL3, TL4, TL5, and TL6, which may be electrically connected to the first touch bridge TB through the a corresponding contact hole.

As shown in FIG. 9, the first touch bridge TB may include a first bridge part TBls including a first metal and a second bridge part TBg including a second metal different from the first metal. But embodiments of the present disclosure are not limited thereto.

For example, the first metal may be the same metal as a light shield located under the driving transistor DRT disposed in the pixel area PA (hereinafter also referred to as a light shield metal). The second metal may be a gate metal forming the gate electrode of the driving transistor DRT or forming the first scan signal line SCL or various signal lines. The second metal may be located on a higher layer than the first metal.

As illustrated in FIG. 9, the first bridge part TBls and the second bridge part TBg, which constitute the first touch bridge TB, may be located at different layers, and may be electrically connected to each other through a plurality of contact holes C1, C2, C3, and C4.

As shown in FIG. 9, the first touch line TL1 may include the first metal, and the first scan signal line SCL may include the second metal. The first touch line TL1 may be located at a lower layer than the first scan signal line SCL.

Meanwhile, the first touch line TL1 may be located at any of the remaining layers except for a layer at which the first touch bridge TB is located, among a first metal layer at which an electrode or a line including the first metal is disposed (e.g., a light shield metal layer), a second metal layer at which an electrode or a line including the second metal is disposed (e.g., a gate metal layer), a third metal layer at which an electrode or a line including the third metal is disposed (e.g., a source-drain metal layer), and a fourth metal layer at which an electrode or a line including the fourth metal is disposed (e.g., a metal layer located between the third metal layer and the pixel electrode layer (the anode electrode layer)). Here, the first metal layer, the second metal layer, the third metal layer, and the fourth metal layer may be located from the bottom to the top in that order. Among the first metal layer, the second metal layer, the third metal layer, and the fourth metal layer, the first metal layer may be the lowermost layer closest to the substrate SUB, and the fourth metal layer may be the uppermost layer farthest from the substrate SUB. But embodiments of the present disclosure are not limited thereto.

In the example shown in FIG. 9, the first touch line TL1 does not cross the first bridge part TBls of the first touch bridge TB. The first touch line TL1 may cross the second bridge part TBg of the first touch bridge TB.

As shown in FIG. 9, the display panel 110 of the transparent touch display device 100 according to exemplary embodiments of the present disclosure may further include a first data line DL1, a second data line DL2, a third data line DL3, and a fourth data line DL4, which are disposed in the pixel area PA.

In the example shown in FIG. 9, each of the first data line DL1, the second data line DL2, the third data line DL3, and the fourth data line DL4 may include a third metal different from the first metal and the second metal.

For example, the first metal may be the same light shield metal as the light shield located under the driving transistor DRT disposed in the pixel area PA. The second metal may be a gate metal forming the gate electrode of the driving transistor DRT or forming the first scan signal line SCL or various signal lines. The third metal may be a source-drain metal forming the source electrode and the drain electrode of the driving transistor DRT or forming various signal lines. The third metal layer at which the third metal is disposed may be located at a higher position than the second metal layer at which the second metal is disposed, and the second metal layer at which the second metal is disposed may be located at a higher position than the first metal layer at which the first metal is disposed.

As shown in FIG. 9, each of the first data line DL1, the second data line DL2, the third data line DL3, and the fourth data line DL4 may cross the first bridge part TBls or the second bridge part TBg of the first touch bridge TB.

As shown in FIG. 9, the display panel 110 of the transparent touch display device 100 according to exemplary embodiments of the present disclosure may further include a reference voltage line RVL disposed in the pixel area PA.

The reference voltage line RVL may be disposed at the center of the pixel area PA (the center in the row direction). The reference voltage line RVL may overlap the display cathode electrode DCE and may be disposed at the center of the display cathode electrode DCE (the center in the row direction).

The reference voltage line RVL may include the first metal and may cross the second bridge part TBg of the first touch bridge TB.

As shown in FIG. 9, the display panel 110 of the transparent touch display device 100 according to exemplary embodiments of the present disclosure may further include a base voltage line BVL, which is disposed in the pixel area PA and overlaps the display cathode electrode DCE.

In the example illustrated in FIG. 9, the base voltage line BVL may include a first base voltage line part BVLg including the second metal and a second base voltage line part BVLs including the third metal, which is different from the first metal and the second metal.

In the example shown in FIG. 9, the second base voltage line part BVLs may include a double-layer part overlapping the first base voltage line part BVLg and a single-layer part not overlapping the first base voltage line part BVLg.

As shown in FIG. 9, the first base voltage line part BVLg may overlap the first bridge part TBls of the first touch bridge TB. The double-layer part of the second base voltage line part BVLs may overlap the first bridge part TBls of the first touch bridge TB.

As shown in FIG. 9, the first base voltage line part BVLg may not overlap the second bridge part TBg of the first touch bridge TB. The double-layer part of the second base voltage line part BVLs may not overlap the second bridge part TBg of the first touch bridge TB.

As shown in FIG. 9, the first base voltage line part BVLg may not cross the first scan signal line SCL, and the second base voltage line part BVLs may cross the first scan signal line SCL.

As shown in FIG. 9, the base voltage line BVL may be disposed between a first side edge of the display cathode electrode DCE and the reference voltage line RVL.

As shown in FIG. 9, the display panel 110 of the transparent touch display device 100 according to exemplary embodiments of the present disclosure may further include a driving voltage line DVL, which is disposed in the pixel area PA and overlaps the display cathode electrode DCE.

In the example illustrated in FIG. 9, the driving voltage line DVL may include a first driving voltage line part DVLg including the second metal and a second driving voltage line part DVLs including the third metal, which is different from the first metal and the second metal.

As shown in FIG. 9, the second driving voltage line part DVLs may include a double-layer part overlapping the first driving voltage line part DVLg and a single-layer part not overlapping the first driving voltage line part DVLg.

As shown in FIG. 9, the first driving voltage line part DVLg may overlap the first bridge part TBls of the first touch bridge TB. The double-layer part of the second driving voltage line part DVLs may overlap the first bridge part TBls of the first touch bridge TB.

However, in the example shown in FIG. 9, the first driving voltage line part DVLg does not overlap the second bridge part TBg of the first touch bridge TB, and the double-layer part of the second driving voltage line part DVLs does not overlap the second bridge part TBg of the first touch bridge TB.

As shown in FIG. 9, the first driving voltage line part DVLg may not cross the first scan signal line SCL, and the second driving voltage line part DVLs may cross the first scan signal line SCL.

As shown in FIG. 9, the driving voltage line DVL may be disposed between a second side edge of the display cathode electrode DCE and the reference voltage line RVL.

As shown in FIG. 9, the display panel 110 of the transparent touch display device 100 according to exemplary embodiments of the present disclosure may further include a base voltage line BVL, which is disposed in the pixel area PA, overlaps the display cathode electrode DCE, and is electrically connected to the display cathode electrode DCE.

As shown in FIG. 9, the display cathode electrode DCE may include an electrode protrusion DCE_PRT. The first touch cathode electrode TCE1 may include an electrode groove TCE_GRV in which the electrode protrusion DCE_PRT of the display cathode electrode DCE is disposed.

The electrode protrusion DCE_PRT of the display cathode electrode DCE and the electrode groove TCE_GRV in the first touch cathode electrode TCE1 may be electrically separated from each other.

As shown in FIG. 9, the base voltage line BVL may include a line protrusion BVLs_PRT overlapping the electrode protrusion DCE_PRT of the display cathode electrode DCE. The line protrusion BVLs_PRT of the base voltage line BVL may be electrically connected to the electrode protrusion DCE_PRT of the display cathode electrode DCE via a display cathode contact pattern CNT_DCE.

As shown in FIG. 9, the first touch line TL1 may overlap the first touch cathode electrode TCE1 and may be bent along the electrode groove TCE_GRV in the first touch cathode electrode TCE1.

As shown in FIG. 9, the display panel 110 of the transparent touch display device 100 according to exemplary embodiments of the present disclosure may further include touch lines TL4, TL5, and TL6, which are disposed in the second transmissive area TA2, cross the first touch bridge TB, and overlap the second touch cathode electrode TCE2.

Figure 10:
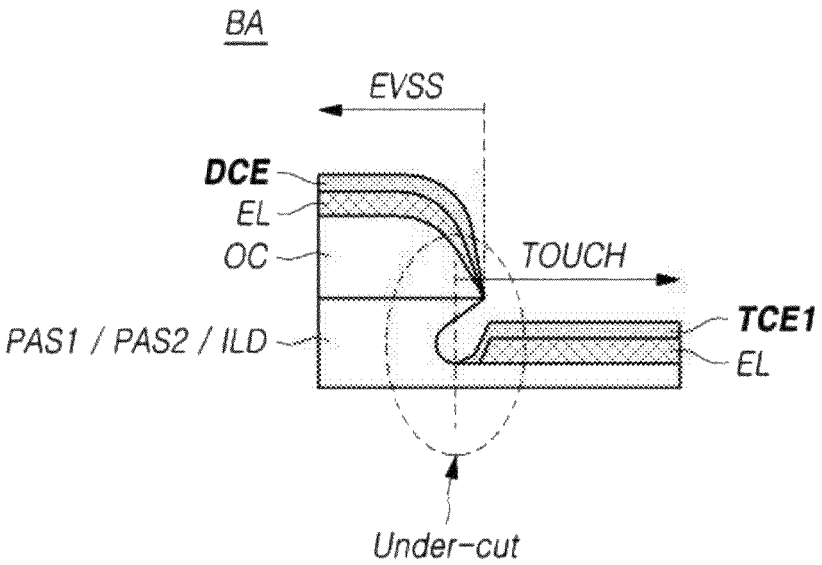
FIG. 10 is a cross-sectional view of a cathode division boundary area in the display panel of the transparent touch display device according to exemplary embodiments of the present disclosure.

FIG. 10 is a cross-sectional view of the cathode division boundary area BA shown in FIG. 9 in the display panel 110 of the transparent touch display device 100 according to exemplary embodiments of the present disclosure.

Where the display panel 110 of the transparent touch display device 100 according to exemplary embodiments of the present disclosure has the cathode division structure, the display cathode electrode DCE, the first touch cathode electrode TCE1, and the second touch cathode electrode TCE2 may be cathode electrode material parts separated by an under-cut portion of a lower layer located under the cathode electrode layer CEL.

The lower layer to which the under-cut may be applied may include, for example, a pixel electrode layer on which the anode electrode AE is formed, an overcoat layer, or a bank, but embodiments of the present disclosure are not limited thereto. In some cases, the lower layer may include at least one of a first passivation layer PAS1, a second passivation layer PAS2, or an interlayer insulating layer ILD.

Due to the above-described under-cut structure of the lower layer, the display cathode electrode DCE, the first touch cathode electrode TCE1, and the second touch cathode electrode TCE2 may include or be formed from the same cathode electrode material. The cathode electrode material may include, for example, a transparent conductive material.

In other words, as shown in FIG. 10, in the cathode division boundary area BA shown in FIG. 9, a lower layer located under the display cathode electrode DCE may have an under-cut shape in which a lower portion of the lower layer is depressed inwards. Here, the cathode division boundary area BA may be a boundary area BA between the display cathode electrode DCE and the first touch cathode electrode TCE1.

Similarly, in the boundary area between the display cathode electrode DCE and the second touch cathode electrode TCE2, the lower layer located under the display cathode electrode DCE may also have an under-cut shape in which a lower portion of the lower layer is depressed inwards.

In other words, where the display panel 110 of the transparent touch display device 100 according to exemplary embodiments of the present disclosure has the cathode division structure, the display panel 110 may further include a lower layer located under the display cathode electrode DCE and having an under-cut structure.

The lower layer may have an under-cut structure in which a lower portion thereof is depressed inwards. The display cathode electrode DCE and the first touch cathode electrode TCE1 may be electrically separated from each other at a point BA corresponding to the under-cut structure of the lower layer, and the display cathode electrode DCE and the second touch cathode electrode TCE2 may be electrically separated from each other at another point corresponding to the under-cut structure of the lower layer. But embodiments of the present disclosure are not limited thereto.

Figure 11:
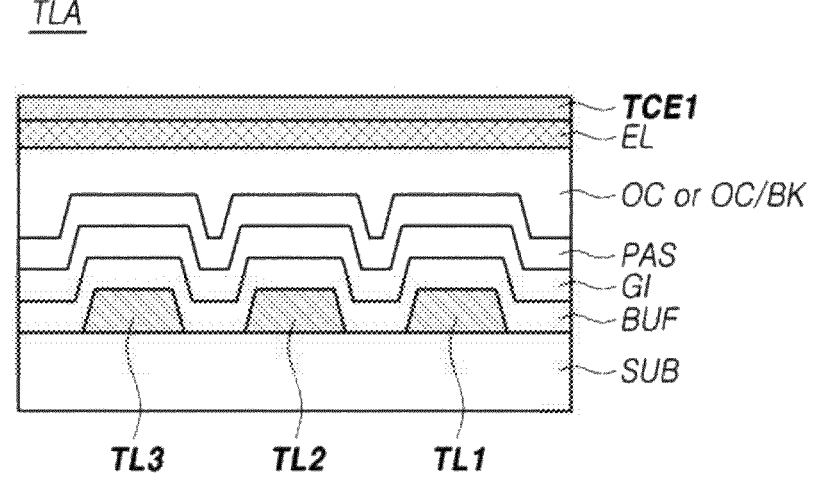
FIG. 11 is a cross-sectional view of a touch line area in the display panel of the transparent touch display device according to exemplary embodiments of the present disclosure.

FIG. 11 is a cross-sectional view of a touch line area TLA in the display panel 110 of the transparent touch display device 100 according to exemplary embodiments of the present disclosure.

In the example shown in FIG. 11, the first touch cathode electrode TCE1 and the second touch cathode electrode TCE2 may be electrically connected to each other by the first touch bridge TB to constitute one first touch electrode TE.

As shown in FIG. 11, the first touch line TL1, the second touch line TL2, and the third touch line TL3 may overlap the first touch cathode electrode TCE1 in the first transmissive area TA1.

With reference to FIGS. 11 and 9 together, among the first touch line TL1, the second touch line TL2, and the third touch line TL3, which overlap the first touch cathode electrode TCE1, only the first touch line TL1 may be electrically connected to the first touch cathode electrode TCE1. Among the first touch line TL1, the second touch line TL2, and the third touch line TL3, which overlap the first touch cathode electrode TCE1, the second touch line TL2 and the third touch line TL3 may not be electrically connected to the first touch cathode electrode TCE1. Alternatively, among the first touch line TL1, the second touch line TL2, and the third touch line TL3, only the first touch line TL1 or only the second touch line TL2 may be electrically connected to the first touch cathode electrode TCE1, and the other touch lines may not electrically connected to the first touch cathode electrode TCE1.

In the example illustrated in FIG. 11, the first to third touch lines TL1, TL2, and TL3 may be located at the light shield metal layer on the substrate SUB, and a buffer layer BUF may be disposed so as to cover the first to third touch lines TL1, TL2, and TL3. The buffer layer BUF may be formed by inorganic film in a single-layer structure or a multilayer structure. For example, the inorganic film single layer may be a silicon oxide (SiOx) film, a silicon nitride (SiNx) film, or a silicon oxynitride (SiON) film and inorganic films in multiple layers may formed by alternately stacking one or more silicon oxide (SiOx) films, one or more silicon nitride (SiNx) films, one or more silicon oxynitride (SiOxNy) films, and one or more amorphous silicon (a-Si), but the present disclosure is not limited thereto.

As shown in FIG. 11, a gate insulating layer GI may be disposed on the buffer layer BUF, and a passivation layer PAS may be disposed on the gate insulating layer GI. For example, the gate insulating layer GI may be an inorganic layer. For example, the gate insulating layer GI may be composed of a single layer or multilayers of SiOx, SiNx or SiOxNy, but is not limited thereto. The passivation layer PAS, which is a kind of dielectric (e.g., an inorganic dielectric), may be formed in a single-layer structure made of a silicon oxide (SiOx) film, a silicon nitride (SiNx) film, or a silicon oxynitride (SiOxNy) film or a multilayer structure thereof, etc. An overcoat layer OC made of any insulating material may be disposed on the passivation layer PAS, or a bank BK may be further disposed on the overcoat layer OC. The overcoat layer may be made of at least one selected from an acrylic-based resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and photoresist, but the present disclosure is not limited thereto. The bank may be formed of an organic layer such as an acrylic resin, an epoxy resin, a phenolic resin, a polyamide resin, and a polyimide resin.

As shown in FIG. 11, an emission layer EL may be located on the overcoat layer OC or the bank BK on the overcoat layer OC. The first touch cathode electrode TCE1 may be located on the emission layer EL.

In the example shown in FIG. 11, the emission layer EL overlapping the first to third touch lines TL1, TL2, and TL3 may be a part extending from the pixel area PA and may not perform a light emission function because the anode electrode AE is not present thereunder.

Figure 12:
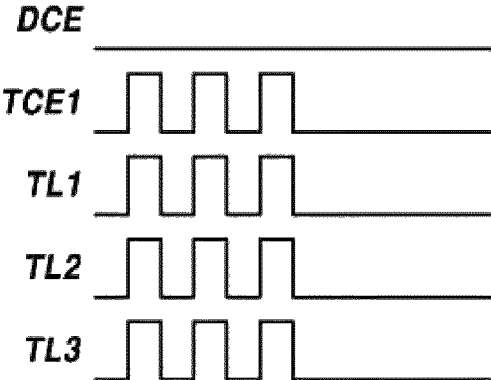
FIG. 12 is a view showing signals applied to a touch cathode electrode and touch lines in the display panel of the transparent touch display device according to exemplary embodiments of the present disclosure.

FIG. 12 is a view showing signals applied to the first touch cathode electrode TCE1 and to the first to third touch lines TL1, TL2, and TL3 in the display panel 110 of the transparent touch display device 100 according to exemplary embodiments of the present disclosure.

As shown in FIG. 12, the first touch line TL1 and the first touch cathode electrode TCE1 may have the same electrical state. In addition, the second touch line TL2 and the third touch line TL3 may also have the same electrical state as the first touch cathode electrode TCE1.

This is because, in the first transmissive area TA1, the first touch line TL1, the second touch line TL2, and the third touch line TL3 may overlap the first touch cathode electrode TCE1, and signals having the same signal characteristics may be applied to all of the first touch line TL1, the second touch line TL2, the third touch line TL3, and the first touch cathode electrode TCE1. Here, the same signal characteristics may mean that at least one of the frequency, phase, or amplitude is identical.

In more detail, since the touch driving signal output from the touch driving circuit 160 is applied to the first touch cathode electrode TCE1 through the first touch line TL1, the first touch line TL1 and the first touch cathode electrode TCE1 may have the same electrical state. In addition, a touch driving signal for touch sensing or a load-free driving signal corresponding to a touch driving signal for reduction of parasitic capacitance may be applied to the second touch line TL2 and the third touch line TL3.

Here, the load-free driving signal may have the same signal characteristics as the touch driving signal. The same signal characteristics may mean that at least one of the frequency, phase, or amplitude is identical. Accordingly, all of the first touch line TL1, the second touch line TL2, the third touch line TL3, and the first touch cathode electrode TCE1 may be in an electrical state in which signals having the same signal characteristics are applied thereto.

As shown in FIG. 12, since the first touch line TL1 and the first touch cathode electrode TCE1 have the same electrical state, unnecessary parasitic capacitance between the first touch line TL1 and the first touch cathode electrode TCE1 may be prevented, and consequently, touch sensitivity may be improved.

Figure 13:
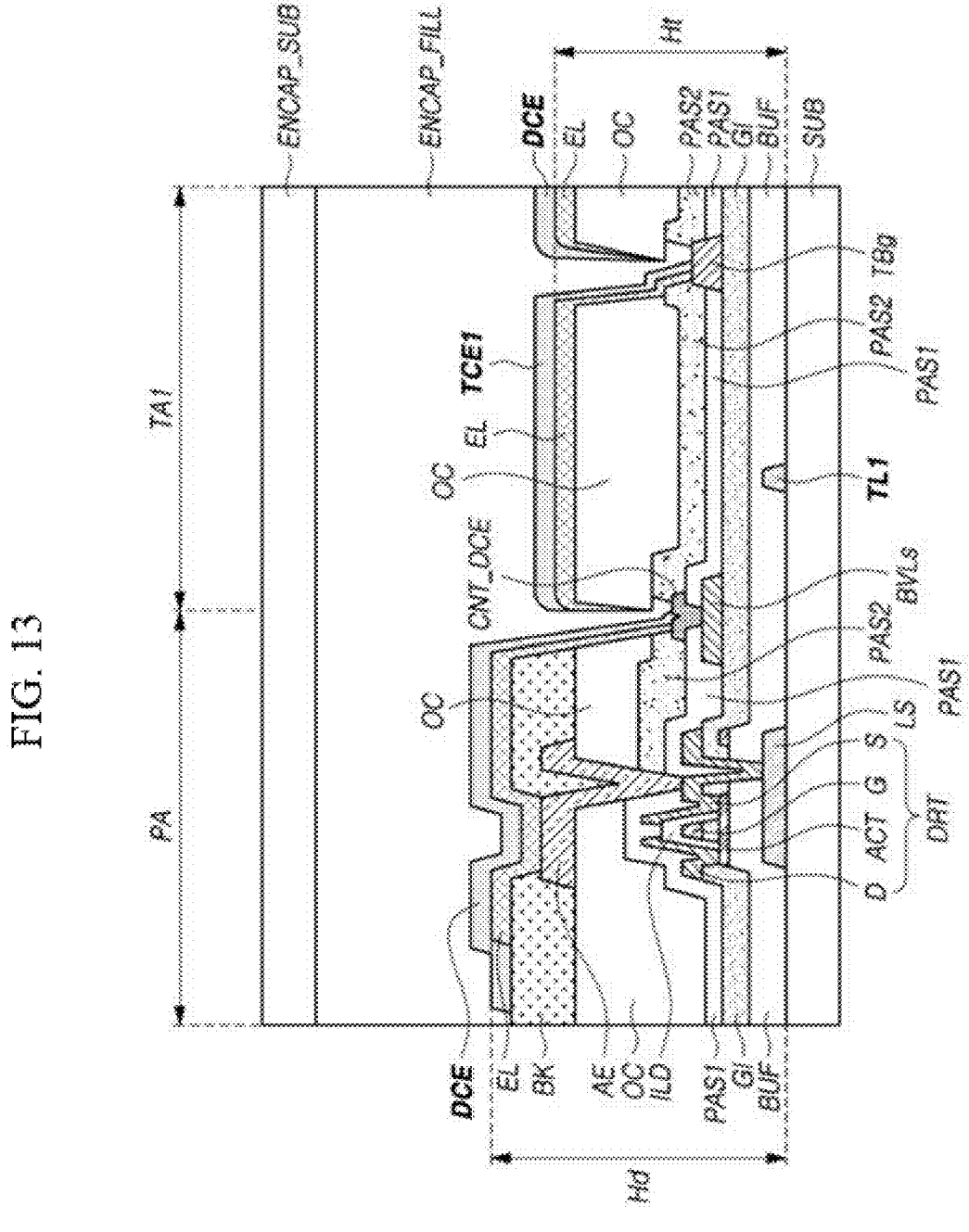
FIG. 13 is a cross-sectional view of the display panel of the transparent touch display device according to exemplary embodiments of the present disclosure.

FIG. 13 is a cross-sectional view of the display panel 110 of the transparent touch display device 100 according to exemplary embodiments of the present disclosure. However, for convenience of explanation, the cross-sectional structures of portions of the pixel area PA and the first transmissive area TA1 are illustrated in brief in FIG. 13.

In FIG. 13, for convenience of explanation, only the first touch line TL1 among the first to third touch lines TL1, TL2, and TL3 overlapping the first touch cathode electrode TCE1 is shown. The arrangements of the second and third touch lines TL2, and TL3 can refer to that of the first touch line TL1, which are omitted here.

As shown in FIG. 13, the driving transistor DRT, the anode electrode AE, and the display cathode electrode DCE may be disposed in the pixel area PA. The first touch cathode electrode TCE1, the first touch line TL1, and the first touch bridge TB may be disposed in the first transmissive area TA1.

In the example illustrated in FIG. 13, the anode electrode AE may be disposed at the pixel electrode layer (the anode electrode layer) and located above the driving transistor DRT in the pixel area PA, and may be electrically connected to the source electrode S or the drain electrode D of the driving transistor DRT.

The emission layer EL may be located between the anode electrode AE and the display cathode electrode DCE.

As shown in FIG. 13, the display panel 110 of the transparent touch display device 100 according to exemplary embodiments of the present disclosure may further include a light shield LS, which is located below the driving transistor DRT and overlaps an active layer ACT of the driving transistor DRT. The layer at which the light shield LS is located may be referred to as a light shield metal layer. The light shield LS may be disposed in the pixel area PA.

The first touch line TL1 overlapping the first touch cathode electrode TCE1 may be located at the light shield metal layer. Accordingly, the light shield LS and the first touch line TL1 may include or be formed from the same or similar material (a light shield metal).

Meanwhile, although the first touch line TL1 is shown in FIG. 13 as being located at the first metal layer (the light shield metal layer), the first touch line TL1 may be located at any of various other layers. For example, the first touch line TL1 may be located at any of the remaining layers except for the layer at which the second bridge portion TBg of the first touch bridge TB is located, among the first metal layer (the light shield metal layer), the second metal layer (the gate metal layer), the third metal layer (the source-drain metal layer), and the fourth metal layer (the metal layer located between the third metal layer and the pixel electrode layer (the anode electrode layer)).

As shown in FIG. 13, the display panel 110 of the transparent touch display device 100 according to exemplary embodiments of the present disclosure may have a top emission structure in which light for displaying an image is emitted to the upper surface of an encapsulation substrate ENCAP_SUB. To this end, the display cathode electrode DCE, the first touch cathode electrode TCE1, and the second touch cathode electrode TCE2 may include or be formed from the same or similar transparent conductive material such as indium-tin-oxide and indium-zinc-oxide, and the anode electrode AE may include a reflective metal material such as Al, Al alloy, Ag, Ag alloy, Mg, Mg alloy, APC (Ag—Pd—Cu), and/or the like.

The vertical structure of the display panel 110 will be described in more detail with reference to FIG. 13.

As illustrated in FIG. 13, the light shield metal layer, which is the first metal layer, may be located on the substrate SUB. Here, the light shield metal layer, which is the first metal layer, may be a layer at which the light shield metal, which is the first metal, is disposed. The light shield metal layer may be a metal layer closest to the substrate SUB.

As shown in FIG. 13, the light shield LS and the first touch line TL1 may be disposed at the light shield metal layer, which is the first metal layer. In addition, the first bridge part TBls of the first touch bridge TB may be disposed at the light shield metal layer. The light shield LS, the first touch line TL1, and the first bridge part TBls of the first touch bridge TB may include the light shield metal.

As shown in FIG. 13, the buffer layer BUF may be disposed so as to cover the light shield LS and the first touch line TL1. The buffer layer BUF may be formed in a single-layer structure or a multilayer structure.

As shown in FIG. 13, the active layer ACT may be disposed on the buffer layer BUF, and the gate insulating layer GI may be disposed so as to cover the active layer ACT. The active layer ACT may be formed of amorphous silicon (a-Si), polycrystalline silicon (poly-Si), an organic semiconductor or the like. But embodiments are not limited thereto.

As shown in FIG. 13, the gate electrode G and the second bridge part TBg of the first touch bridge TB may be disposed on the gate insulating layer GI. The layer at which the gate electrode G and the second bridge part TBg of the first touch bridge TB are located may be referred to as a gate metal layer, which is the second metal layer. The gate electrode G and the second bridge part TBg of the first touch bridge TB may include a gate metal, which is the second metal. In addition, the first scan signal line SCL, the first base voltage line part BVLg of the base voltage line BVL and the first driving voltage line part DVLg of the driving voltage line DVL may be further disposed at the gate metal layer.

As shown in FIG. 13, the interlayer insulating layer ILD may be disposed on the gate electrode G, and the source electrode S and the drain electrode D, which include a source-drain metal (or the third metal), may be disposed on the interlayer insulating layer ILD. In addition, the second base voltage line part BVLs of the base voltage line BVL, the first data line DL1, the second data line DL2, the third data line DL3, and the fourth data line DL4 and the second driving voltage line part DVLs of the driving voltage line DVL may be further disposed at the source-drain metal layer, which is the third metal layer.

As shown in FIG. 13, the source electrode S may be connected to one side of the active layer ACT through a through-hole in the gate insulating layer GI. The drain electrode D may be connected to the other side of the active layer ACT through another through-hole in the gate insulating layer GI.

As shown in FIG. 13, the source electrode S may be connected to the light shield LS through through-holes in the gate insulating layer GI and the buffer layer BUF. Accordingly, body effect may be reduced, and thus the driving transistor DRT may stably operate.

As shown in FIG. 13, the first passivation layer PAS1 may be disposed on the source-drain metal layer. The display cathode contact pattern CNT_DCE may be disposed on the first passivation layer PAS1. The layer at which the display cathode contact pattern CNT_DCE is located may be referred to as a fourth metal layer. The display cathode contact pattern CNT_DCE may be connected to the second base voltage line part BVLs of the base voltage line BVL through a through-hole in the first passivation layer PAS1. Here, with reference to FIGS. 13 and 9 together, a portion of the second base voltage line part BVLs of the base voltage line BVL, to which the display cathode contact pattern CNT_DCE is connected, may correspond to the line protrusion BVLs_PRT of the base voltage line BVL.

As shown in FIG. 13, the second passivation layer PAS2 may be disposed so as to cover the display cathode contact pattern CNT_DCE on the first passivation layer PAS1. A metal layer between the first passivation layer PAS1 and the second passivation layer PAS2 may be a fourth metal layer made of the fourth metal, at which the display cathode contact pattern CNT_DCE may be located.

As shown in FIG. 13, the overcoat layer OC may be disposed on the first passivation layer PAS1 and the second passivation layer PAS2. A lower portion of the overcoat layer OC may have an under-cut structure.

As shown in FIG. 13, the anode electrode AE may be disposed on the overcoat layer OC, and may be connected to the source electrode S of the driving transistor DRT through through-holes in the overcoat layer OC and the first passivation layer PAS1.

As shown in FIG. 13, the bank BK may be disposed on the anode electrode AE. The bank BK may include an opening, and the upper surface of a portion of the anode electrode AE may be exposed through the opening in the bank BK. The bank BK may be located in the pixel area PA and may not be disposed in the first transmissive area TA1.

As shown in FIG. 13, the emission layer EL may be disposed both in the pixel area PA and in the first transmissive area TA1. In the pixel area PA, the emission layer EL may be located on the bank BK and may be in contact with the anode electrode AE in the opening in the bank BK. In the first transmissive area TA1, the emission layer EL may be disposed on the overcoat layer OC.

However, in the example illustrated in FIG. 13, the emission layer EL in the pixel area PA and the emission layer EL in the first transmissive area TA1 are not connected to each other and are disconnected from each other at the boundary area between the pixel area PA and the first transmissive area TA1. That is, the emission layer EL may be divided into parts at the boundary area between the pixel area PA and the first transmissive area TA1 by the under-cut structure of the overcoat layer OC.

As shown in FIG. 13, the cathode electrode material in the cathode electrode layer CEL may be located on the emission layer EL, and may be divided into parts in the boundary area between the pixel area PA and the first transmissive area TA1 by the under-cut structure of the overcoat layer OC. Accordingly, the cathode electrode material located on the emission layer EL in the pixel area PA may form the display cathode electrode DCE, and the cathode electrode material located on the emission layer EL in the first transmissive area TA1 may form the first touch cathode electrode TCE1.

As shown in FIG. 13, in the boundary area between the pixel area PA and the first transmissive area TA1, the display cathode electrode DCE may be electrically connected to the display cathode contact pattern CNT_DCE through through-holes in the overcoat layer OC and the second passivation layer PAS2. Therefore, the display cathode electrode DCE may be electrically connected to the second base voltage line part BVLs of the base voltage line BVL through the display cathode contact pattern CNT_DCE.

As shown in FIG. 13, in another boundary area between the pixel area PA and the first transmissive area TA1, the first touch cathode electrode TCE1 may be electrically connected to the second bridge part TBg of the first touch bridge TB through through-holes in the overcoat layer OC and the second passivation layer PAS2.

In the example shown in FIG. 13, the display cathode electrode DCE, the first touch cathode electrode TCE1, and the second touch cathode electrode TCE2 (not shown) may be located at the cathode electrode layer CEL, and the encapsulation layer ENCAP may be disposed on the display cathode electrode DCE, the first touch cathode electrode TCE1, and the second touch cathode electrode TCE2, which are located at the cathode electrode layer CEL.

As shown in FIG. 13, the encapsulation layer ENCAP may include an encapsulation substrate, a dam located between the thin-film transistor array substrate SUB and the encapsulation substrate ENCAP_SUB along the outer edge of the display area DA, and a filler ENCAP FILL charged in the inner space partially or wholly bounded or surrounded by the dam.

The encapsulation layer ENCAP may be formed in any of various types. Unlike the type of encapsulation layer ENCAP shown as an example in FIG. 13, the encapsulation layer ENCAP may include one or more inorganic layers and one or more organic layers.

Meanwhile, in the example shown in FIG. 13, the maximum separation distance Ht between the first touch cathode electrode TCE1 and the substrate SUB and the maximum separation distance Ht between the second touch cathode electrode TCE2 and the substrate SUB may be shorter than the maximum separation distance Hd between the display cathode electrode DCE and the substrate SUB.

Figure 14:
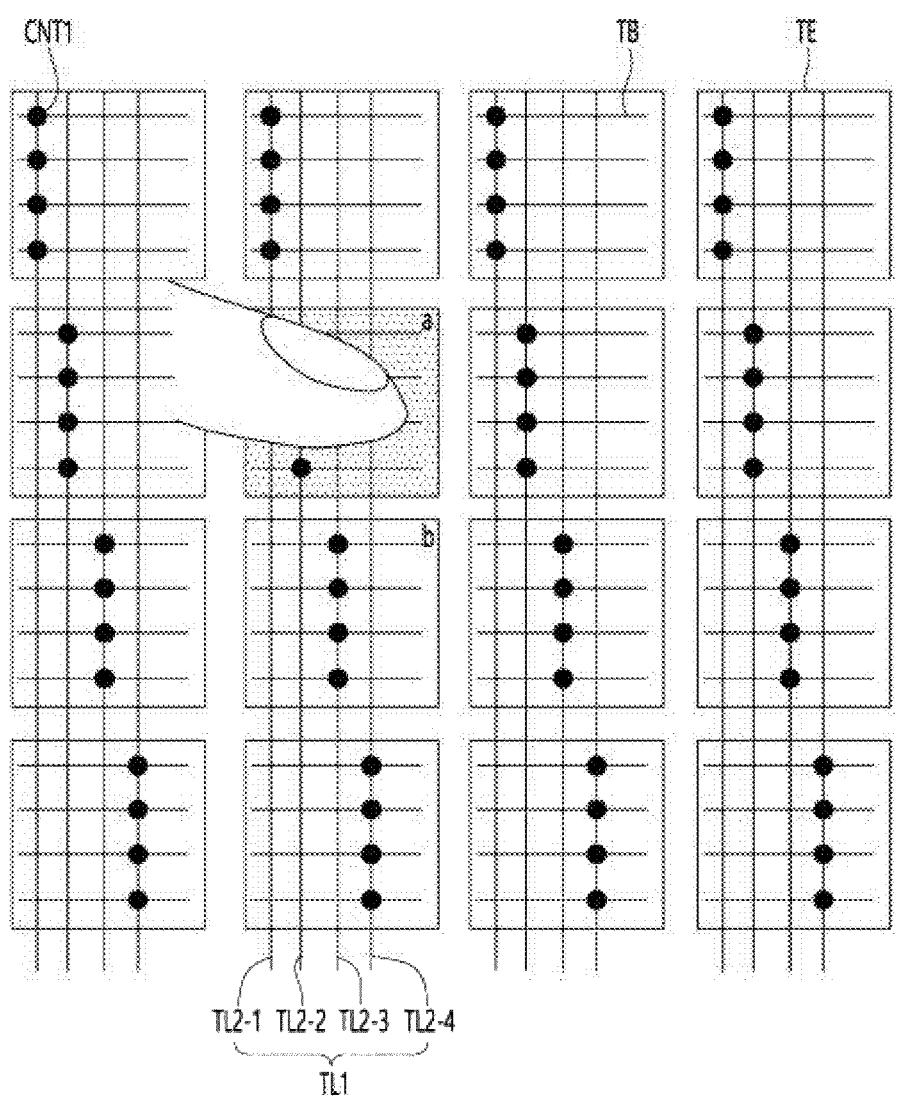
FIG. 14 is an explanatory diagram schematically showing the touch sensor of the transparent touch display device 100 according to exemplary embodiments of the present disclosure.
Figure 15:
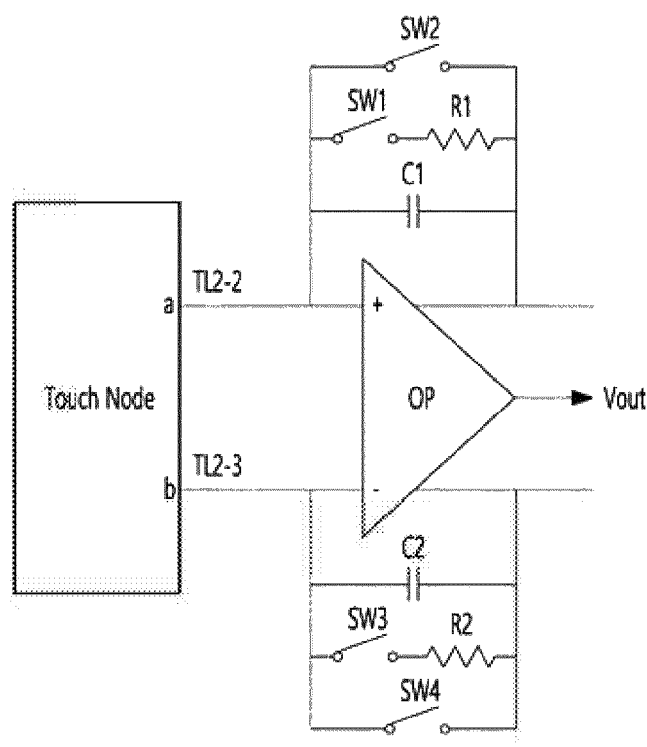
FIG. 15 is an equivalent circuit diagram of a differential driving self-capacitance sensing mode of the touch sensing circuit 150 shown in FIG. 1 in the transparent touch display device 100 according to exemplary embodiments of the present disclosure.

FIG. 14 is an explanatory diagram schematically showing the touch sensor of the transparent touch display device 100 according to exemplary embodiments of the present disclosure. FIG. 15 is an equivalent circuit diagram of a differential driving self-capacitance sensing mode of the touch sensing circuit 150 shown in FIG. 1 in the transparent touch display device 100 according to exemplary embodiments of the present disclosure.

That is, FIG. 14 shows only a plurality of touch electrodes TE, a plurality of touch lines TL, a plurality of first contact holes CNT1, and a plurality of touch bridges TB in the display panel 110 of the transparent touch display device 100 according to exemplary embodiments of the present disclosure described with reference to FIGS. 6A to 6C.

As shown in FIG. 14, the plurality of touch lines TL may respectively correspond to the plurality of touch electrodes TE, and the plurality of touch electrodes TE may be connected to the touch driving circuit (160 in FIG. 1) via the plurality of touch lines TL.

As shown in FIG. 14, a plurality of touch lines TL may be disposed across the area in which one touch electrode TE is formed, and one of the plurality of touch lines TL may be electrically connected to a plurality of touch bridges TB disposed in the area of one touch electrode TE through a plurality of first contact holes CNT1.

As shown in FIG. 15, two adjacent ones among the plurality of touch lines TL may be used to sense touch. In detail, a voltage difference between a touch line electrically connected to a touch electrode that is touched and a touch line electrically connected to a touch electrode that is not touched may be used to sense touch.

As illustrated in FIGS. 14 and 15, when one touch electrode "a" among the plurality of touch electrodes TE is touched with a touch object, such as a finger or a pen, a first touch line TL2-2 to which the touch electrode "a" is electrically connected and a second touch line TL2-3 to which another touch electrode "b" adjacent to the touch electrode "a" is electrically connected may be used to sense touch.

As shown in FIGS. 14 and 15, the touch sensing circuit 150 may include a differential amplifier OP configured to amplify a voltage difference between the touch electrode "a"

that is touched and the touch electrode "b" that is not touched and to output the amplified voltage difference.

As shown in FIG. 15, the differential amplifier OP may include a first input terminal, to which the first touch line TL2-2 electrically connected to the touch electrode "a" that is touched is electrically connected, a second input terminal, to which the second touch line TL2-3 electrically connected to the touch electrode "b" that is not touched is electrically connected, and an output terminal Vout configured to amplify a voltage difference between the first input terminal and the second input terminal and to output the amplified voltage difference.

As shown in FIG. 15, the differential amplifier OP may further include first and second feedback capacitors C1 and C2, first and second resistors R1 and R2, and first to fourth switches SW1 to SW4 in order to control the amplification gain and setting or resetting of the differential amplifier OP.

In the equivalent circuit of the differential driving self-capacitance sensing mode shown in FIG. 15, the output voltage Vout of the differential amplifier is shown in Equation 1 below.

$$V_{out} = \left\{ 1 + \frac{\sqrt{C_p} + C_{finger}}{C_{fb}} \right\} \text{Gain} * V_{in} \qquad \text{[Equation 1]}$$

Here, Cp represents parasitic capacitance, Cfinger represents finger capacitance, and Cfb represents feedback capacitance. The parasitic capacitance Cp may include a parasitic capacitance Ctc between the touch electrode TE and the display cathode electrode DCE, a parasitic capacitance Cta between the touch electrode TE and the anode electrode AE, a parasitic capacitance Cte between the touch electrode TE and an EVDD line, a parasitic capacitance Ctv the touch electrode TE and an EVSS line, a parasitic capacitance Ctd between the touch electrode TE and the data line DL, a parasitic capacitance Ctr between the touch electrode TE and the reference voltage line RVL, and a parasitic capacitance Cts between the touch electrode TE and the scan signal line SCL.

In the example touch sensor structure shown in FIG. 14, when a finger comes into contact with the touch sensor, the touch electrode TE that is touched may increase in temperature due to body temperature.

In addition, the organic/inorganic materials forming the touch electrode TE may vary in dielectric constant (have a thermal drift) due to the increase in temperature, leading to increase in parasitic capacitance Cp. The parasitic capacitance Cp may increase for a certain period of time after the finger is removed from the touch electrode TE.

Figure 16:
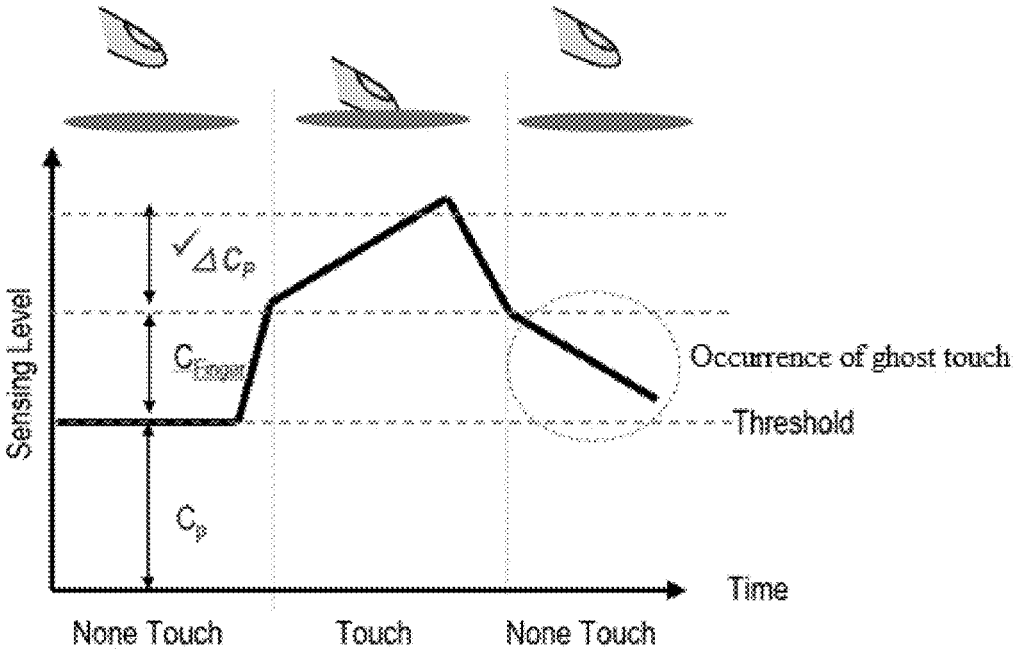
FIG. 16 is a graph showing output levels of the equivalent circuit of the differential driving self-capacitance sensing mode before, while, and after the touch electrode TE is touched with a finger in the exemplary touch sensor structure shown in FIG. 14.

FIG. 16 is a graph showing output levels of the equivalent circuit of the differential driving self-capacitance sensing mode before, while, and after the touch electrode TE is touched with the finger in the example touch sensor structure shown in FIG. 14.

As shown in FIG. 16, when the touch electrode TE is touched with the finger, the temperature of the touch electrode becomes higher than that before the touch electrode TE is touched with the finger, and the output level of the equivalent circuit of the differential driving self-capacitance sensing mode may also increase.

When the finger is removed from the touch electrode TE after a certain period of time of touch, the output level does not immediately decrease to the output level before the touch, but gradually returns to the output level before the touch in a certain period of time.

The reason for this is that the temperature of the touch electrode increases due to a body temperature, and thus the dielectric constant of the touch electrode TE changes. In this case, the parasitic capacitance Cp shown in Equation 1 may increase. This is called a temperature ghost.

Further, an error may occur in a touch sensing value due to the temperature ghost, which makes it difficult to accurately sense touch. Therefore, mitigating the temperature ghost problem may improve the accuracy of touch sensing.

FIGS. 17 to 25 are explanatory diagrams schematically showing the touch sensor of the transparent touch display device 100 for reduction of temperature ghost according to exemplary embodiments of the present disclosure. FIGS. 17 to 25 show a plurality of touch electrodes TE1 to TE3 disposed in one column, a plurality of touch lines TL1, TL2, TL3, . . . , a plurality of first contact holes CNT1, and a plurality of touch bridges TB1 to TB18 in the display panel 110 of the transparent touch display device 100 according to exemplary embodiments of the present disclosure described with reference to FIGS. 6A to 6C.

With reference to FIGS. 17 to 20 and FIGS. 6B and 6C, each of the touch electrodes TE1 to TE3 may include 20×18 touch cathode electrodes TCE, which are arranged in 18 rows and 20 columns. That is, one touch electrode TE may include first to eighteenth touch cathode electrode rows, and each of the first to eighteenth touch cathode electrode rows includes twenty touch cathode electrodes TCE.

Eighteen touch bridges TB1 to TB18 may be disposed in the area of each of the touch electrodes TE1 to TE3. The eighteen touch bridges TB1 to TB18 may respectively correspond to the first to eighteenth touch cathode electrode rows. The twenty touch cathode electrodes TCE included in each of the first to eighteenth touch cathode electrode rows may be electrically connected to each other via a respective one of the eighteen touch bridges TB1 to TB18. However, the present disclosure is not limited to the above examples.

For convenience of explanation, the touch cathode electrodes TCE are shown in FIGS. 17 to 20 as being arranged in 18 rows and 20 columns. However, the disclosure is not limited thereto. The touch cathode electrodes TCE may be arranged in "m" rows and "n" columns (m and n being natural numbers).

Figure 18:
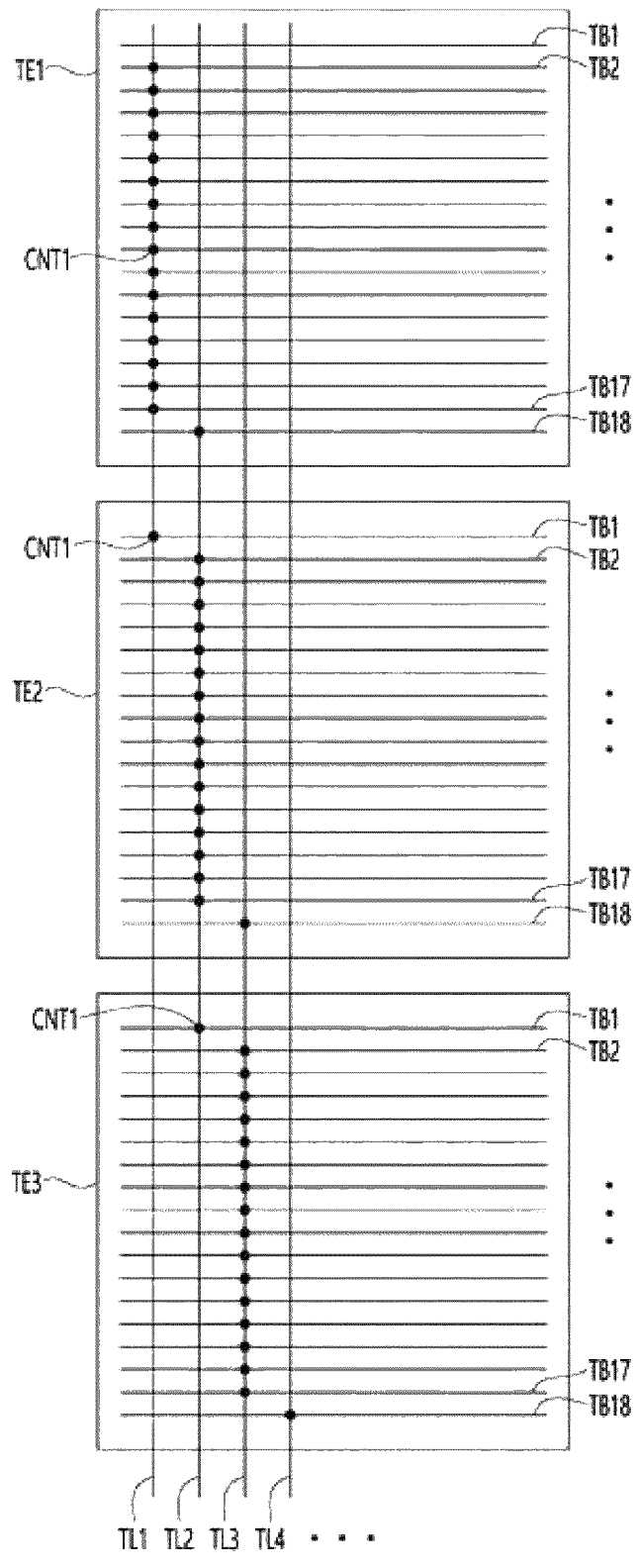

As shown in FIG. 18, the plurality of touch lines TL1, TL2, TL3, . . . may respectively correspond to the plurality of touch electrodes TE1 to TE3, and the plurality of touch electrodes TE1 to TE3 may be connected to the touch driving circuit (160 in FIG. 1) via the plurality of touch lines TL1, TL2, TL3, . . . .

As shown in FIG. 18, the plurality of touch lines TL1, TL2, TL3, . . . may be disposed across the area in which each of the touch electrodes TE1 to TE3 is formed, and one of the plurality of touch lines TL1, TL2, TL3, . . . may be electrically connected respectively to the plurality of touch bridges TB1 to TB18 disposed in the area of one of the touch electrodes TE1, TE2, and TE3 and to the plurality of touch bridges TB1 to TB18 disposed in the area of another touch electrode adjacent thereto through the plurality of first contact holes CNT1.

As shown in FIG. 18, among the plurality of touch lines TL1, TL2, TL3, . . . , the second touch line TL2 may be electrically connected to the second to seventeenth touch bridges TB2 to TB17 (but not to the first and eighteenth touch bridges TB1 and TB18) among the first to eighteenth touch bridges TB1 to TB18 disposed in the area of the second touch electrode TE2 through the plurality of corresponding first contact holes CNT1, and may be electrically connected to the eighteenth touch bridge TB18 disposed in the area of the first touch electrode TE1 and to the first touch bridge TB1 disposed in the area of the third touch electrode TE3 through the plurality of corresponding first contact holes CNT1.

In addition, the first touch bridge TB1 disposed in the area of the second touch electrode TE2 may be electrically connected to the first touch line TL1 through the corresponding first contact hole CNT1, and the eighteenth touch bridge TB18 disposed in the area of the second touch electrode TE2 may be electrically connected to the third touch line TL3 through the corresponding first contact hole CNT1.

In the above structure, the order in which the touch bridges are connected to the second touch line TL2 may be varied.

Figure 19:
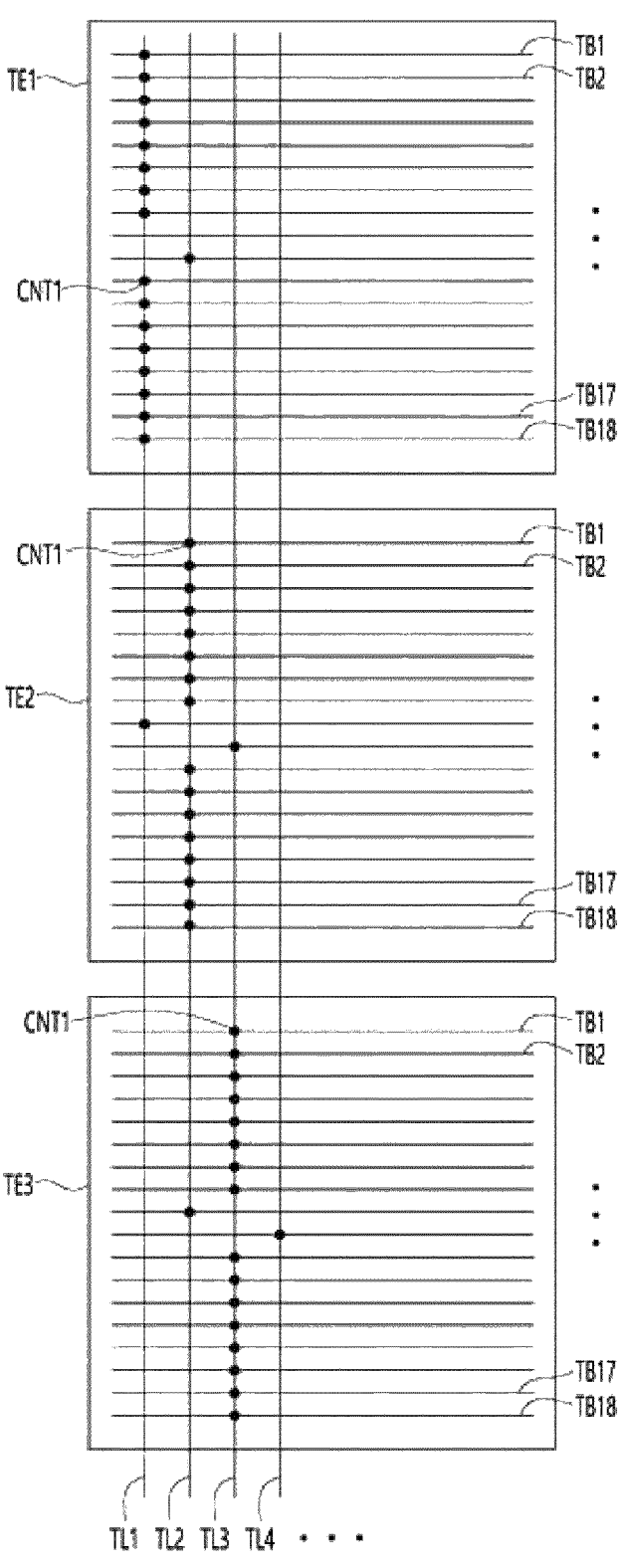

As shown in FIG. 19, among the plurality of touch lines TL1, TL2, TL3, . . . , the second touch line TL2 may be electrically connected to the first to eighth touch bridges TB1 to TB8 and the eleventh to eighteenth touch bridges TB11 to TB18 (but not to the ninth and tenth touch bridges TB9 and TB10) among the first to eighteenth touch bridges TB1 to TB18 disposed in the area of the second touch electrode TE2 through the plurality of corresponding first contact holes CNT1, and may be electrically connected to the tenth touch bridge TB10 disposed in the area of the first touch electrode TE1 and to the ninth touch bridge TB9 disposed in the area of the third touch electrode TE3 through the plurality of corresponding first contact holes CNT1.

In addition, the ninth touch bridge TB9 disposed in the area of the second touch electrode TE2 may be electrically connected to the first touch line TL1 through the corresponding first contact hole CNT1, and the tenth touch bridge TB10 disposed in the area of the second touch electrode TE2 may be electrically connected to the third touch line TL3 through the corresponding first contact hole CNT1.

Figure 20:
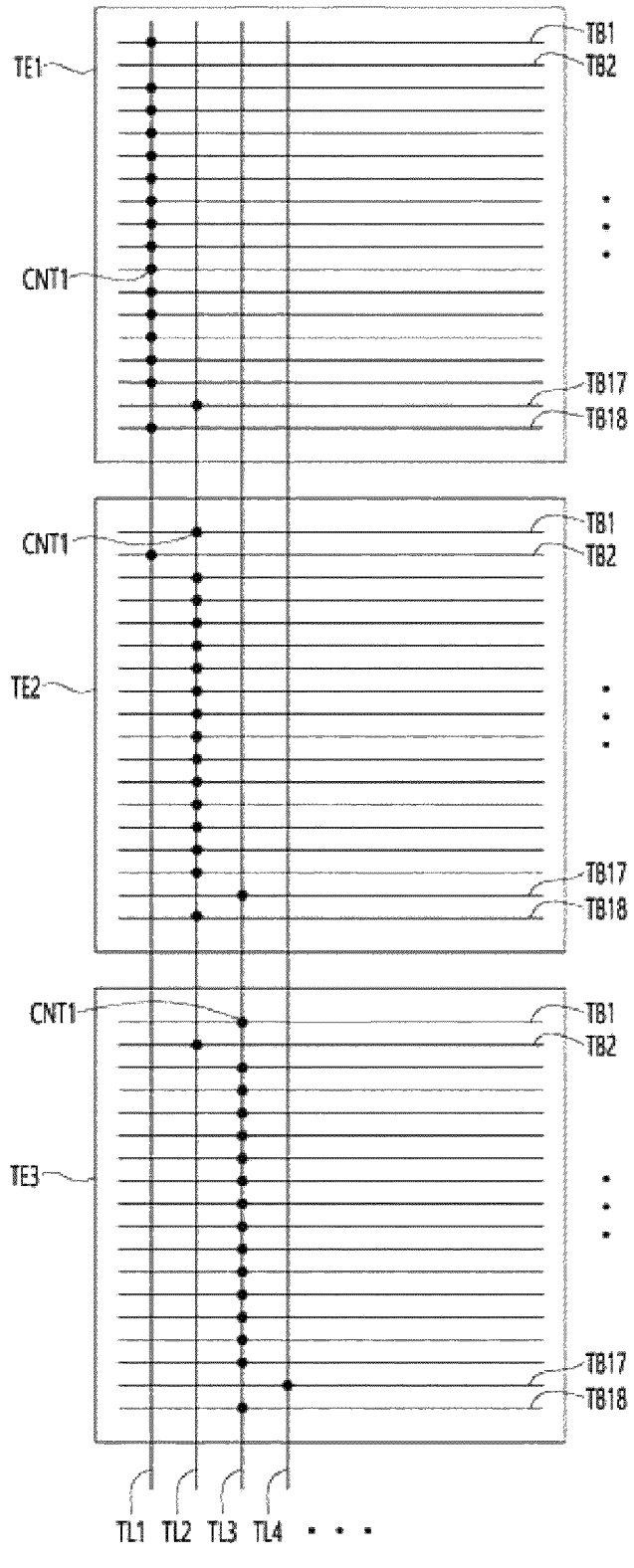

As shown in FIG. 20, among the plurality of touch lines TL1, TL2, TL3, . . . , the second touch line TL2 may be electrically connected to touch bridges TB1, TB3 to TB16, and TB18 (but not to the second and seventeenth touch bridges TB2 and TB17) among the first to eighteenth touch bridges TB1 to TB18 disposed in the area of the second touch electrode TE2 through the plurality of corresponding first contact holes CNT1, and may be electrically connected to the seventeenth touch bridge TB17 disposed in the area of the first touch electrode TE1 and to the second touch bridge TB2 disposed in the area of the third touch electrode TE3 through the plurality of corresponding first contact holes CNT1.

In addition, the second touch bridge TB2 disposed in the area of the second touch electrode TE2 may be electrically connected to the first touch line TL1 through the corresponding first contact hole CNT1, and the seventeenth touch bridge TB17 disposed in the area of the second touch electrode TE2 may be electrically connected to the third touch line TL3 through the corresponding first contact hole CNT1.

In the same way as described with reference to FIGS. 18 to 20, the second touch line TL2 may be electrically connected to all but two touch bridges among the plurality of touch bridges TB1 to TB18 disposed in the area of the second touch electrode TE2 through the plurality of corresponding first contact holes CNT1, and may be electrically connected to one of the plurality of touch bridges TB1 to TB18 disposed in the area of the first touch electrode TE1 and to one of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, the touch bridges not electrically connected to the second touch line TL2 may be electrically connected respectively to the remaining touch lines TL1 and TL3 except for the second touch line TL2.

With reference to FIGS. 17 and 21 to 23 and FIGS. 6B and 6C, each of the touch electrodes TE1 to TE3 may include 20×18 touch cathode electrodes TCE, which are arranged in 18 rows and 20 columns. That is, one touch electrode TE may include first to eighteenth touch cathode electrode rows, and each of the first to eighteenth touch cathode electrode rows may include twenty touch cathode electrodes TCE.

Eighteen touch bridges TB1 to TB18 may be disposed in the area of each of the touch electrodes TE1 to TE3. The eighteen touch bridges TB1 to TB18 may respectively correspond to the first to eighteenth touch cathode electrode rows. The twenty touch cathode electrodes TCE included in each of the first to eighteenth touch cathode electrode rows may be electrically connected to each other via the respective one of the eighteen touch bridges TB1 to TB18.

Figure 21:
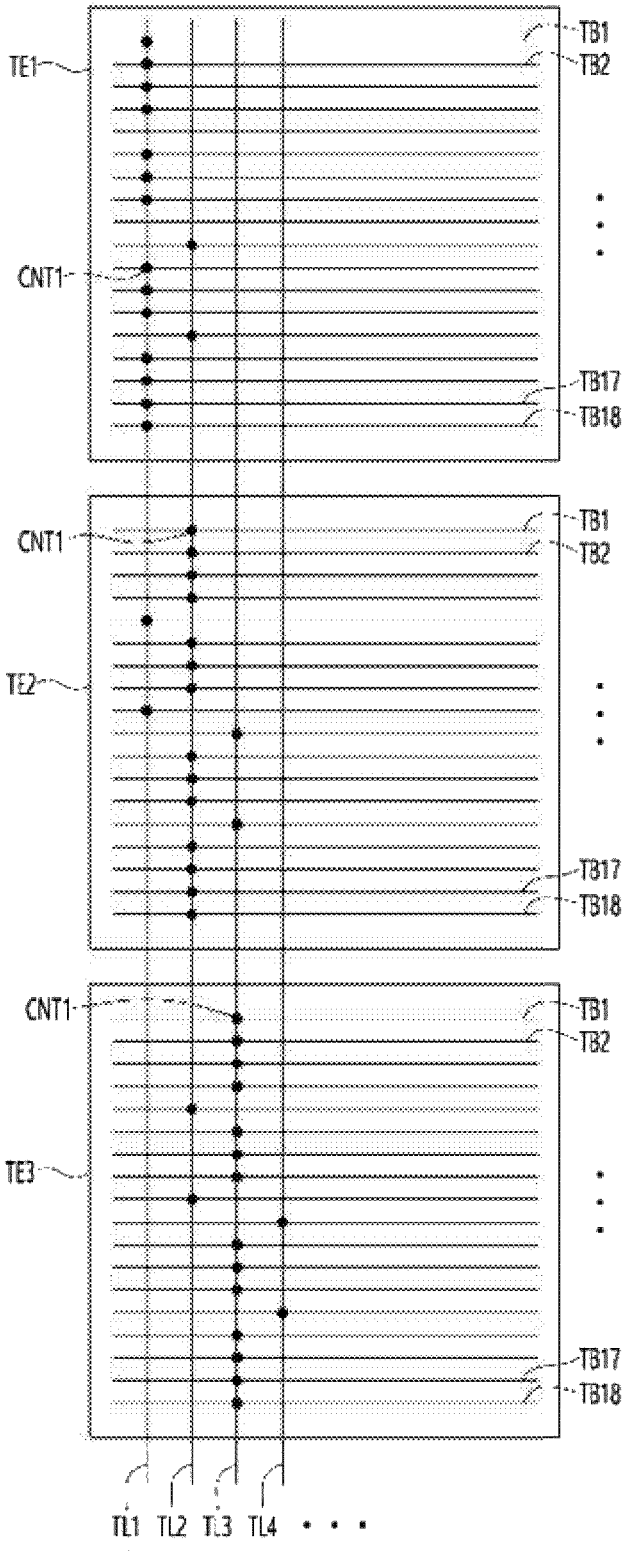
Figure 22:
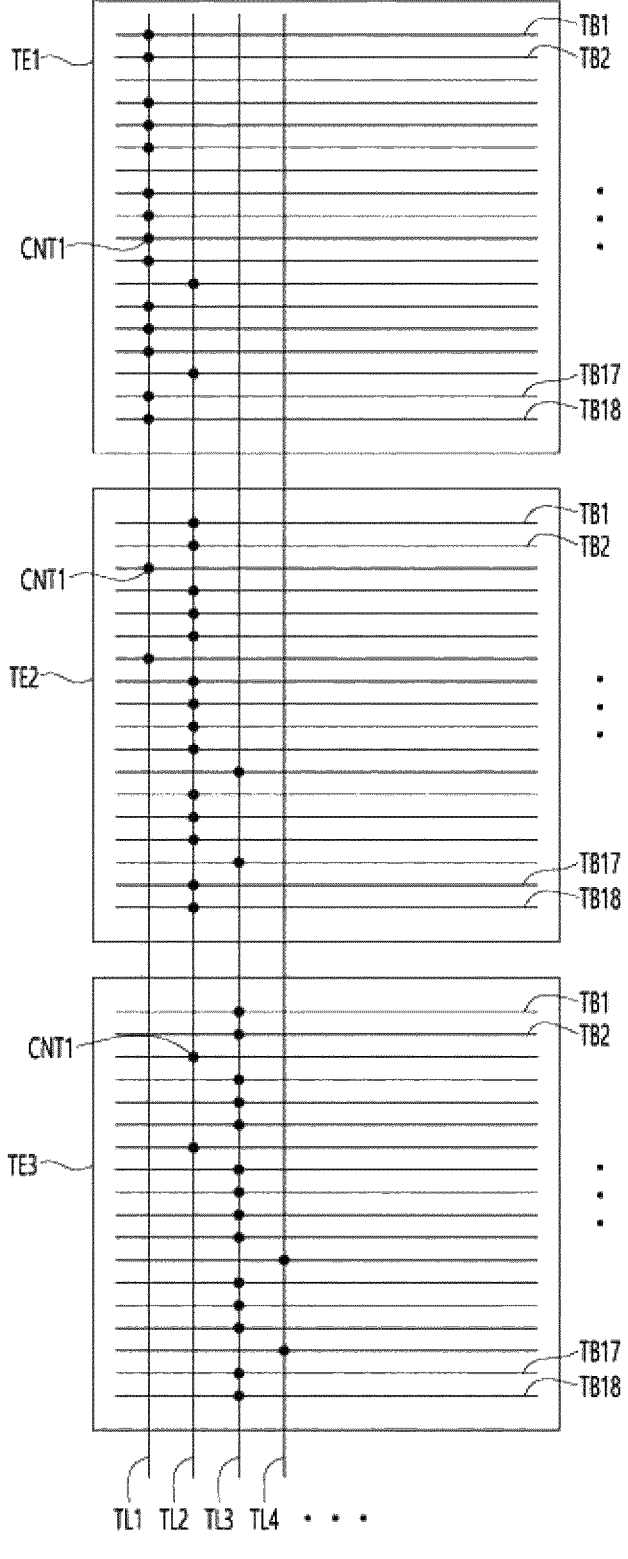
Figure 23:
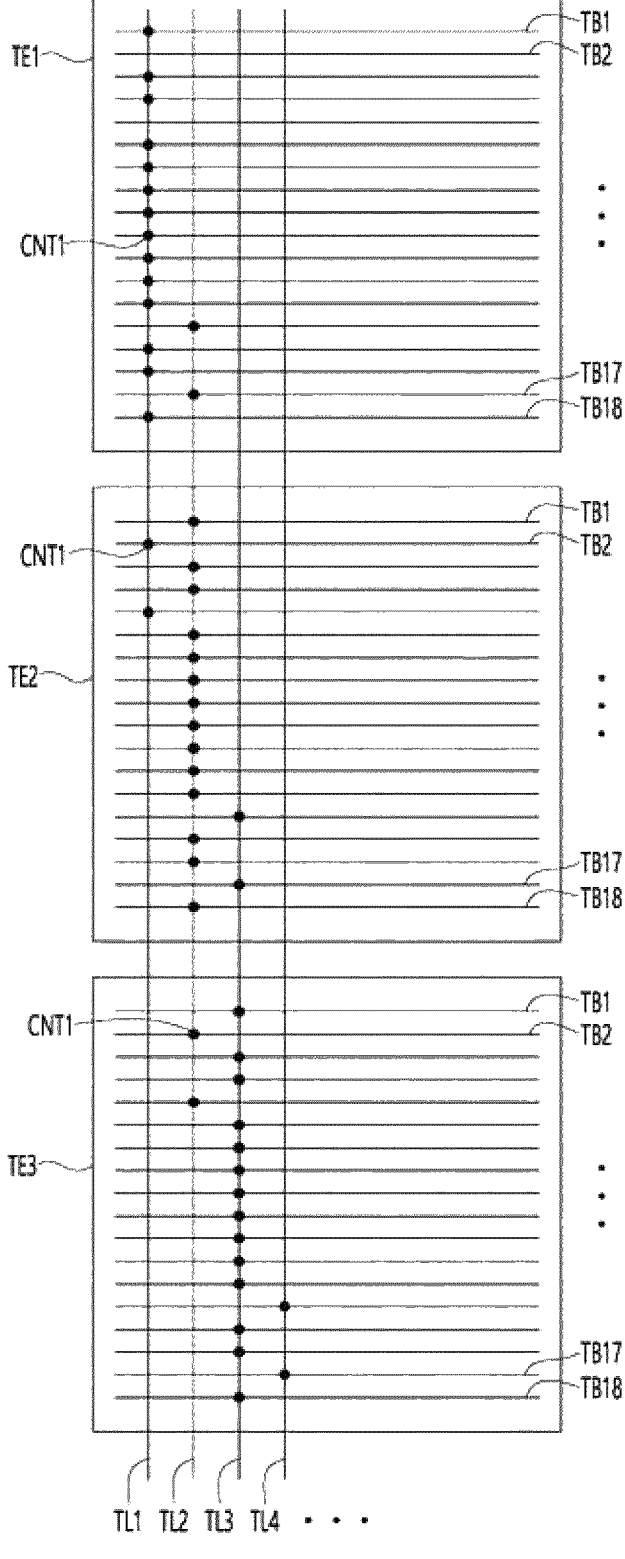

For convenience of explanation, the touch cathode electrodes TCE are shown in FIGS. 21 to 23 as being arranged in 18 rows and 20 columns. However, the disclosure is not limited thereto. The touch cathode electrodes TCE may be arranged in "m" rows and "n" columns (m and n being natural numbers).

As shown in FIG. 21, the plurality of touch lines TL1, TL2, TL3, . . . may respectively correspond to the plurality of touch electrodes TE1 to TE3, and the plurality of touch electrodes TE1 to TE3 may be connected to the touch driving circuit (160 in FIG. 1) via the plurality of touch lines TL1, TL2, TL3, . . . .

As shown in FIG. 21, the plurality of touch lines TL1, TL2, TL3, . . . may be disposed across the area in which each of the touch electrodes TE1 to TE3 is formed, and one of the plurality of touch lines TL1, TL2, TL3, . . . may be electrically connected to the plurality of touch bridges TB1 to TB18 disposed in the area of one of the touch electrodes TE1, TE2, and TE3 and to the plurality of touch bridges TB1 to TB18 disposed in the area of another touch electrode adjacent thereto through the plurality of corresponding first contact holes CNT1.

As shown in FIG. 21, among the plurality of touch lines TL1, TL2, TL3, . . . , the second touch line TL2 may be electrically connected to touch bridges TB1 to TB4, TB6 to TB8, TB11 to TB13, and TB15 to TB18 (but not to the fifth, ninth, tenth, and fourteenth touch bridges TB5, TB9, TB10, and TB14) among the first to eighteenth touch bridges TB1 to TB18 disposed in the area of the second touch electrode TE2 through the plurality of corresponding first contact holes CNT1, and may be electrically connected to the tenth and fourteenth touch bridges TB10 and TB14 disposed in the area of the first touch electrode TEL and to the fifth and ninth touch bridges TB5 and TB9 disposed in the area of the third touch electrode TE3 through the plurality of corresponding first contact holes CNT1.

In addition, the fifth and ninth touch bridges TB5 and TB9 disposed in the area of the second touch electrode TE2 may be electrically connected to the first touch line TL1 through the corresponding first contact holes CNT1, and the tenth and fourteenth touch bridges TB10 and TB14 disposed in the area of the second touch electrode TE2 may be electrically connected to the third touch line TL3 through the corresponding first contact holes CNT1.

In the above structure, the order in which the touch bridges are connected to the second touch line TL2 may be varied.

As shown in FIG. 22, among the plurality of touch lines TL1, TL2, TL3, . . . , the second touch line TL2 may be electrically connected to touch bridges TB1, TB2, TB4 to TB6, TB8 to TB11, TB13 to TB15, TB17, and TB18 (but not to the third, seventh, twelfth, and sixteenth touch bridges TB3, TB7, TB12, and TB16) among the first to eighteenth touch bridges TB1 to TB18 disposed in the area of the second touch electrode TE2 through the plurality of corresponding first contact holes CNT1, and may be electrically connected to the twelfth and sixteenth touch bridges TB12 and TB16 disposed in the area of the first touch electrode TE1 and to the third and seventh touch bridges TB3 and TB7 disposed in the area of the third touch electrode TE3 through the plurality of corresponding first contact holes CNT1.

In addition, the third and seventh touch bridges TB3 and TB7 disposed in the area of the second touch electrode TE2 may be electrically connected to the first touch line TL1 through the corresponding first contact holes CNT1, and the twelfth and sixteenth touch bridges TB12 and TB16 disposed in the area of the second touch electrode TE2 may be electrically connected to the third touch line TL3 through the corresponding first contact holes CNT1.

As shown in FIG. 23, among the plurality of touch lines TL1, TL2, TL3, . . . , the second touch line TL2 may be electrically connected to touch bridges TB1, TB3, TB4, TB6 to TB13, TB15, TB16, and TB18 (but not to the second, fifth, fourteenth, and seventeenth touch bridges TB2, TB5, TB14, and TB17) among the first to eighteenth touch bridges TB1 to TB18 disposed in the area of the second touch electrode TE2 through the plurality of corresponding first contact holes CNT1, and may be electrically connected to the fourteenth and seventeenth touch bridges TB14 and TB17 disposed in the area of the first touch electrode TEL and to the second and fifth touch bridges TB2 and TB5 disposed in the area of the third touch electrode TE3 through the plurality of corresponding first contact holes CNT1.

In addition, the second and fifth touch bridges TB2 and TB5 disposed in the area of the second touch electrode TE2 may be electrically connected to the first touch line TL1 through the corresponding first contact holes CNT1, and the fourteenth and seventeenth touch bridges TB14 and TB17 disposed in the area of the second touch electrode TE2 may be electrically connected to the third touch line TL3 through the corresponding first contact holes CNT1.

In the same way as described above, the second touch line TL2 may be electrically connected to all but four touch bridges among the plurality of touch bridges TB1 to TB18 disposed in the area of the second touch electrode TE2 through the plurality of corresponding first contact holes CNT1, and may be electrically connected to two of the plurality of touch bridges TB1 to TB18 disposed in the area of the first touch electrode TEL and to two of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, two of the four touch bridges not electrically connected to the second touch line TL2 may be electrically connected to the first touch line TL1, and the two remaining touch bridges may be electrically connected to the third touch line TL3.

Meanwhile, in the same way as described with reference to FIGS. 17 to 23, the second touch line TL2 may be electrically connected to all but six touch bridges among the plurality of touch bridges TB1 to TB18 disposed in the area of the second touch electrode TE2 through the plurality of corresponding first contact holes CNT1, and may be electrically connected to three of the plurality of touch bridges TB1 to TB18 disposed in the area of the first touch electrode TE1 and to three of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, three of the six touch bridges not electrically connected to the second touch line TL2 may be electrically connected to the first touch line TL1, and the three remaining touch bridges may be electrically connected to the third touch line TL3.

Figure 24:
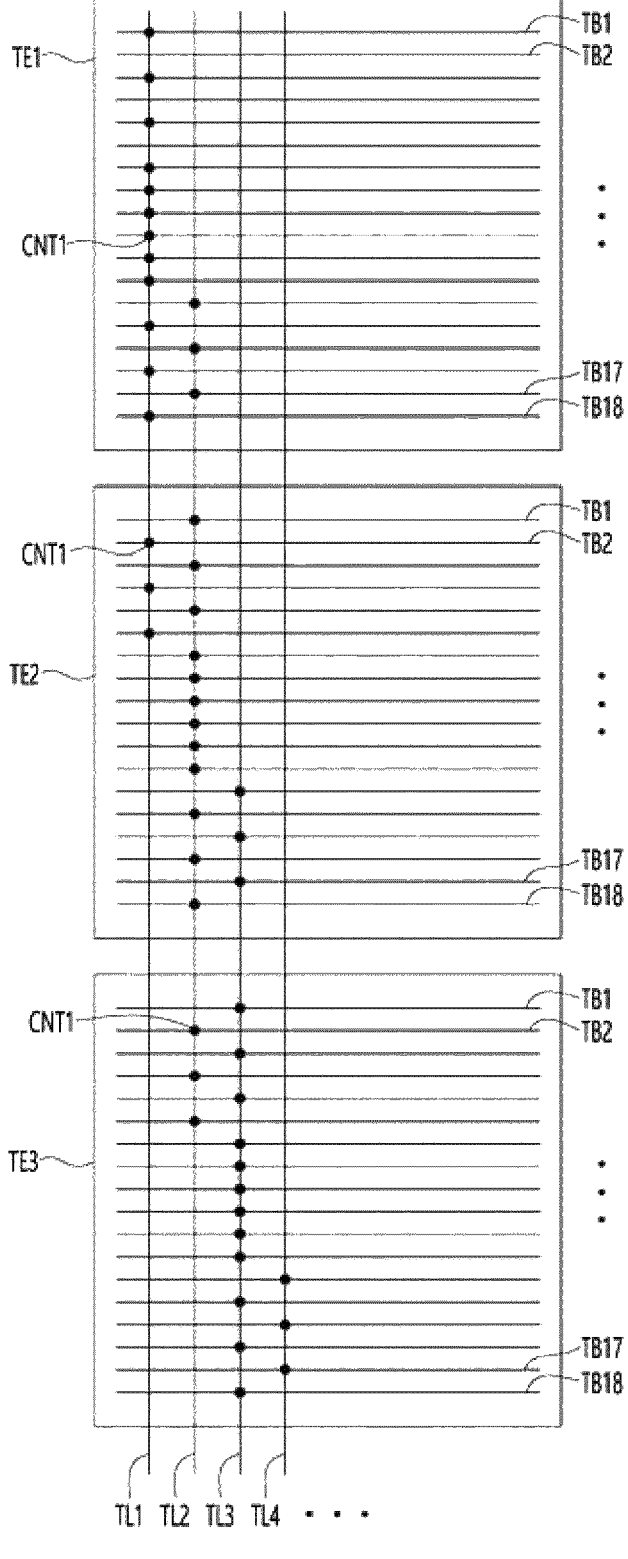

As shown in FIG. 24, among the plurality of touch lines TL1, TL2, TL3, . . . , the second touch line TL2 may be electrically connected to touch bridges TB1, TB3, TB5, TB7 to TB12, TB14, TB16, and TB18 (but not to the second, fourth, sixth, thirteenth, fifteenth, and seventeenth touch bridges TB2, TB4, TB6, TB13, TB15, and TB17) among the first to eighteenth touch bridges TB1 to TB18 disposed in the area of the second touch electrode TE2 through the plurality of corresponding first contact holes CNT1, and may be electrically connected to the thirteenth, fifteenth, and seventeenth touch bridges TB13, TB15, and TB17 disposed in the area of the first touch electrode TE1 and to the second, fourth, and sixth touch bridges TB2, TB4, and TB6 disposed in the area of the third touch electrode TE3 through the plurality of corresponding first contact holes CNT1.

In addition, the second, fourth, and sixth touch bridges TB2, TB4, and TB6 disposed in the area of the second touch electrode TE2 may be electrically connected to the first touch line TL1 through the corresponding first contact holes CNT1, and the thirteenth, fifteenth, and seventeenth touch bridges TB13, TB15, and TB17 disposed in the area of the second touch electrode TE2 may be electrically connected to the third touch line TL3 through the corresponding first contact holes CNT1.

Figure 17:
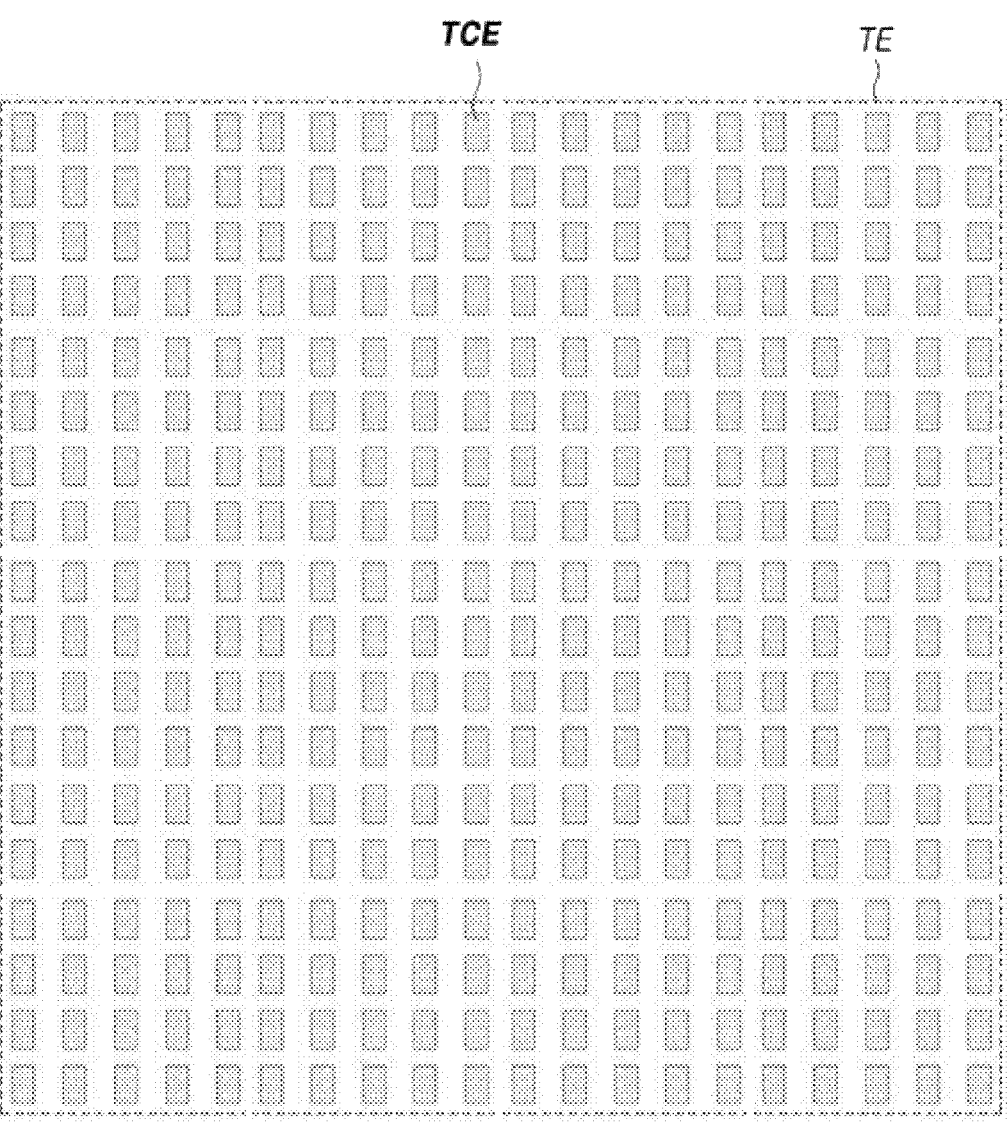
FIGS. 17 to 25 are explanatory diagrams schematically showing the touch sensor of the transparent touch display device 100 for reduction of temperature ghost according to exemplary embodiments of the present disclosure.

In addition, in the same way as described with reference to FIGS. 17 and 23, the second touch line TL2 may be electrically connected to all but eight touch bridges among the plurality of touch bridges TB1 to TB18 disposed in the area of the second touch electrode TE2 through the plurality of corresponding first contact holes CNT1, and may be electrically connected to four of the plurality of touch bridges TB1 to TB18 disposed in the area of the first touch electrode TE1 and to four of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, four of the eight touch bridges not electrically connected to the second touch line TL2 may be electrically connected to the first touch line TL1, and the four remaining touch bridges may be electrically connected to the third touch line TL3.

Figure 25:
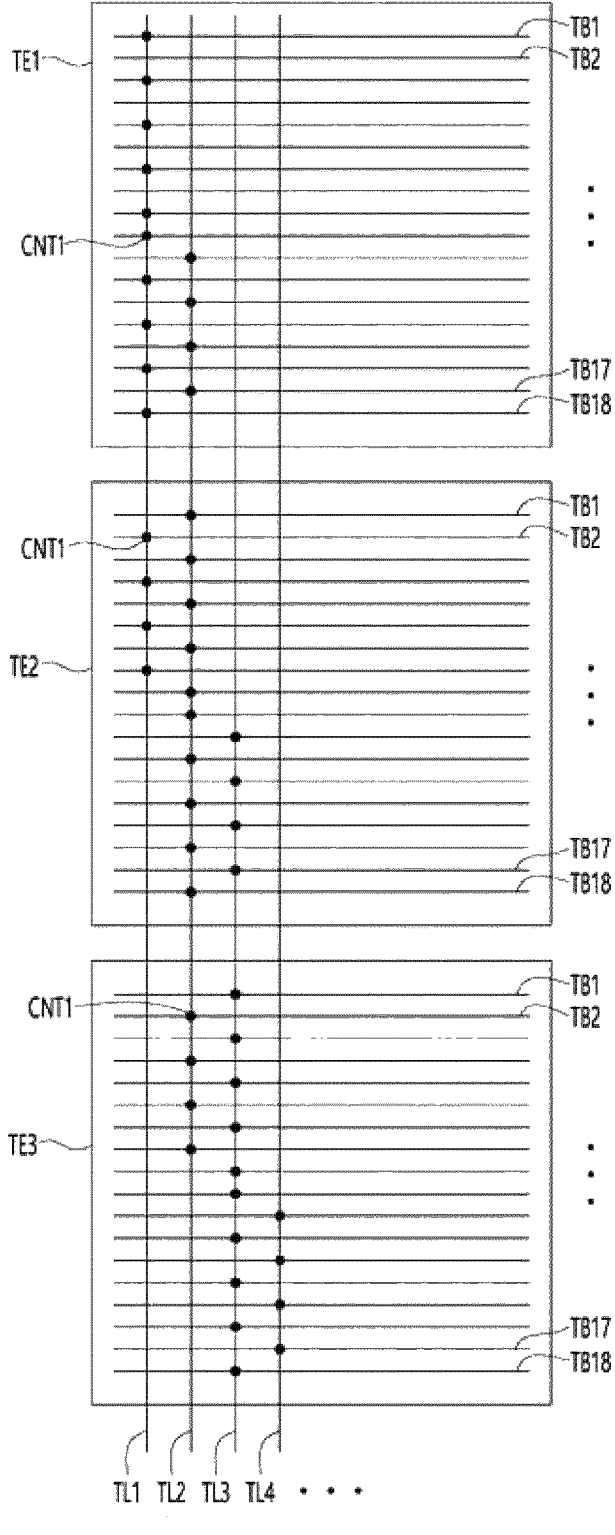

As shown in FIG. 25, among the plurality of touch lines TL1, TL2, TL3, . . . , the second touch line TL2 may be electrically connected to touch bridges TB1, TB3, TB5, TB7, TB9, TB10, TB12, TB14, TB16, and TB18 (but not to the second, fourth, sixth, eighth, eleventh, thirteenth, fifteenth, and seventeenth touch bridges TB2, TB4, TB6, TB8, TB11, TB13, TB15, and TB17) among the first to eighteenth touch bridges TB1 to TB18 disposed in the area of the second touch electrode TE2 through the plurality of corresponding first contact holes CNT1, and may be electrically connected to the eleventh, thirteenth, fifteenth, and seventeenth touch bridges TB11, TB13, TB15, and TB17 disposed in the area of the first touch electrode TEL and to the second, fourth, sixth, and eighth touch bridges TB2, TB4, TB6, and TB8 disposed in the area of the third touch electrode TE3 through the plurality of corresponding first contact holes CNT1.

In addition, the second, fourth, sixth, and eighth touch bridges TB2, TB4, TB6, and TB8 disposed in the area of the second touch electrode TE2 may be electrically connected to the first touch line TL1 through the corresponding first contact holes CNT1, and the eleventh, thirteenth, fifteenth, and seventeenth touch bridges TB11, TB13, TB15, and TB17 disposed in the area of the second touch electrode TE2 may be electrically connected to the third touch line TL3 through the corresponding first contact holes CNT1.

The above-described exemplary embodiments will be summarized with reference to FIG. 25.

Figure 26:
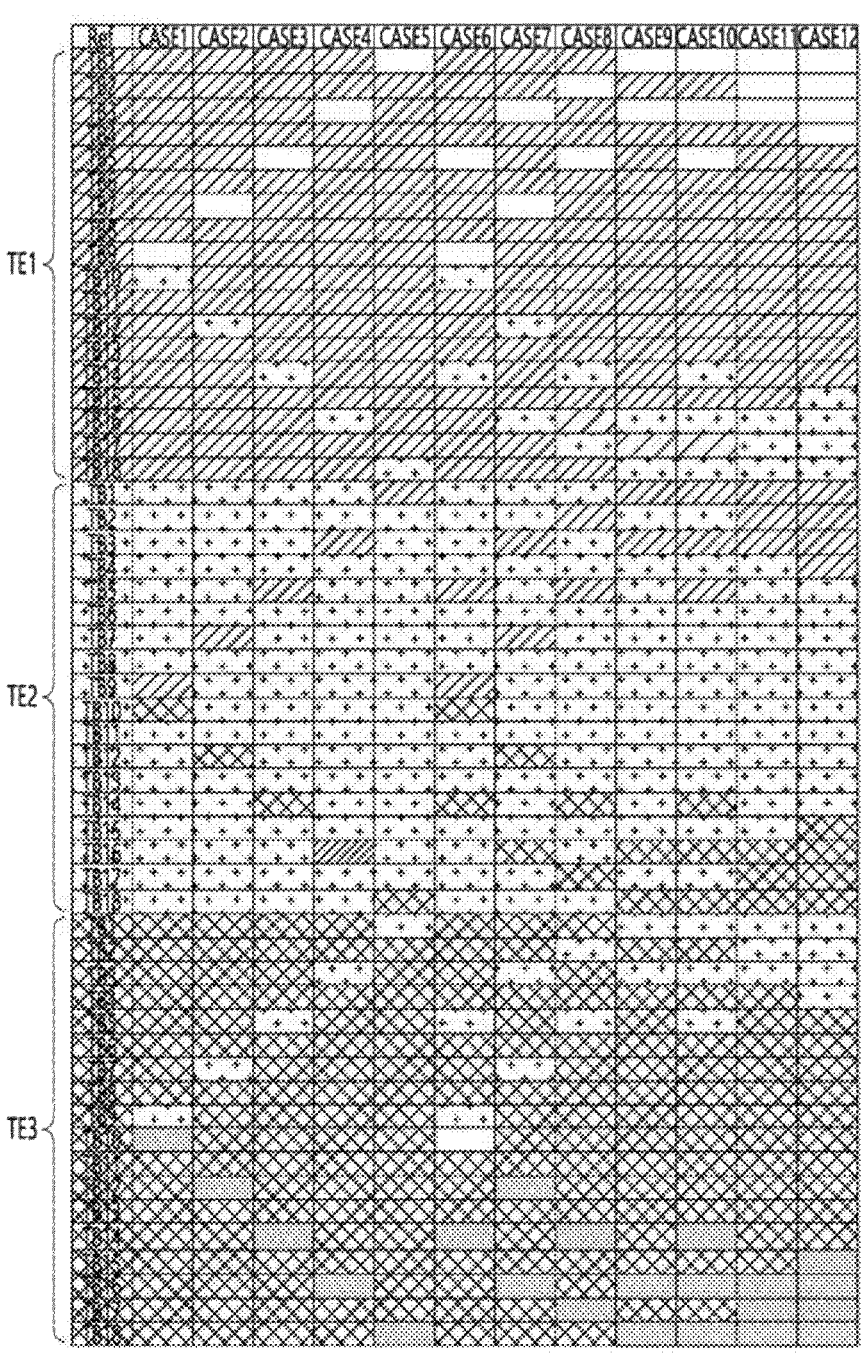
FIG. 26 is a table showing an electrical connection relationship between each touch line TL and touch bridges TB in each touch electrode TE of the transparent touch display device 100 for reduction of temperature ghost according to exemplary embodiments of the present disclosure.

FIG. 26 is a table showing an electrical connection relationship between each touch line TL and the touch bridges TB in each touch electrode TE of the transparent touch display device 100 for reduction of temperature ghost according to various exemplary embodiments of the present disclosure.

As shown in FIG. 26, first to fifth cases (case1 to case5) are example cases in which the second touch line TL2 is electrically connected to all but two touch bridges among the plurality of touch bridges TB1 to TB18 disposed in the area of the second touch electrode TE2 through the plurality of corresponding first contact holes CNT1, as described for example with reference to FIGS. 18 to 20.

The second touch line TL2 may also be electrically connected to one of the plurality of touch bridges TB1 to TB18 disposed in the area of the first touch electrode TEL and to one of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, the two touch bridges not electrically connected to the second touch line TL2 may be electrically connected respectively to the remaining touch lines TL1 and TL3 (except for the second touch line TL2) among the touch lines TL1, TL2, and TL3.

In detail, the first case (case1) is a case in which the second touch line TL2 is electrically connected to the first to eighth touch bridges TB1 to TB8 and the eleventh to eighteenth touch bridges TB11 to TB18 (but not to the ninth and tenth touch bridges TB9 and TB10) among the first to eighteenth touch bridges TB1 to TB18 disposed in the area of the second touch electrode TE2 through the plurality of corresponding first contact holes CNT1, and is electrically connected to the tenth touch bridge TB10 disposed in the area of the first touch electrode TE1 and to the ninth touch bridge TB9 disposed in the area of the third touch electrode TE3 through the plurality of corresponding first contact holes CNT1.

In addition, the ninth touch bridge TB9 disposed in the area of the second touch electrode TE2 is electrically connected to the first touch line TL1 through the corresponding first contact hole CNT1, and the tenth touch bridge TB10 disposed in the area of the second touch electrode TE2 is electrically connected to the third touch line TL3 through the corresponding first contact hole CNT1.

The second case (case2) is a case in which the second touch line TL2 is electrically connected to touch bridges TB1 to TB6, TB8 to TB11, and TB13 to TB18 (but not to the seventh and twelfth touch bridges TB7 and TB12) among the first to eighteenth touch bridges TB1 to TB18 disposed in the area of the second touch electrode TE2 through the plurality of corresponding first contact holes CNT1, and is electrically connected to the twelfth touch bridge TB12 disposed in the area of the first touch electrode TE1 and to the seventh touch bridge TB7 disposed in the area of the third touch electrode TE3 through the plurality of corresponding first contact holes CNT1.

In addition, the seventh touch bridge TB7 disposed in the area of the second touch electrode TE2 is electrically connected to the first touch line TL1 through the corresponding first contact hole CNT1, and the twelfth touch bridge TB12 disposed in the area of the second touch electrode TE2 is electrically connected to the third touch line TL3 through the corresponding first contact hole CNT1.

The third case (case3) is a case in which the second touch line TL2 is electrically connected to touch bridges TB1 to TB4, TB6 to TB13, and TB15 to TB18 (but not to the fifth and fourteenth touch bridges TB5 and TB14) among the first to eighteenth touch bridges TB1 to TB18 disposed in the area of the second touch electrode TE2 through the plurality of corresponding first contact holes CNT1, and is electrically connected to the fourteenth touch bridge TB14 disposed in the area of the first touch electrode TE1 and to the fifth touch bridge TB5 disposed in the area of the third touch electrode TE3 through the plurality of corresponding first contact holes CNT1.

In addition, the fifth touch bridge TB5 disposed in the area of the second touch electrode TE2 is electrically connected to the first touch line TL1 through the corresponding first contact hole CNT1, and the fourteenth touch bridge TB14 disposed in the area of the second touch electrode TE2 is electrically connected to the third touch line TL3 through the corresponding first contact hole CNT1.

The fourth case (case4) is a case in which the second touch line TL2 is electrically connected to touch bridges TB1, TB2, TB4 to TB15, TB17, and TB18 (but not to the third and sixteenth touch bridges TB3 and TB16) among the first to eighteenth touch bridges TB1 to TB18 disposed in the area of the second touch electrode TE2 through the plurality of corresponding first contact holes CNT1, and is electrically connected to the sixteenth touch bridge TB16 disposed in the area of the first touch electrode TE1 and to the third touch bridge TB3 disposed in the area of the third touch electrode TE3 through the plurality of corresponding first contact holes CNT1.

In addition, the third touch bridge TB3 disposed in the area of the second touch electrode TE2 is electrically connected to the first touch line TL1 through the corresponding first contact hole CNT1, and the sixteenth touch bridge TB16 disposed in the area of the second touch electrode TE2 is electrically connected to the third touch line TL3 through the corresponding first contact hole CNT1.

The fifth case (case5) is a case in which the second touch line TL2 is electrically connected to touch bridges TB2 to TB17 (but not to the first and eighteenth touch bridges TB1 and TB18) among the first to eighteenth touch bridges TB1 to TB18 disposed in the area of the second touch electrode TE2 through the plurality of corresponding first contact holes CNT1, and is electrically connected to the eighteenth touch bridge TB18 disposed in the area of the first touch electrode TE1 and to the first touch bridge TB1 disposed in the area of the third touch electrode TE3 through the plurality of corresponding first contact holes CNT1.

In addition, the first touch bridge TB1 disposed in the area of the second touch electrode TE2 is electrically connected to the first touch line TL1 through the corresponding first contact hole CNT1, and the eighteenth touch bridge TB18 disposed in the area of the second touch electrode TE2 is electrically connected to the third touch line TL3 through the corresponding first contact hole CNT1.

As shown in FIG. 26, sixth to ninth cases (case6 to case9) are example cases in which the second touch line TL2 may be electrically connected to all but four touch bridges among the plurality of touch bridges TB1 to TB18 disposed in the area of the second touch electrode TE2 through the plurality of corresponding first contact holes CNT1, as described for example with reference to FIGS. 21 to 23.

The second touch line TL2 may be electrically connected to two of the plurality of touch bridges TB1 to TB18 disposed in the area of the first touch electrode TE1 and to two of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, two of the four touch bridges not electrically connected to the second touch line TL2 may be electrically connected to the first touch line TL1, and the two remaining touch bridges may be electrically connected to the third touch line TL3.

In detail, the sixth case (case6) is a case in which the second touch line TL2 is electrically connected to touch bridges TB1 to TB4, TB6 to TB8, TB11 to TB13, and TB15 to TB18 (but not to the fifth, ninth, tenth, and fourteenth touch bridges TB5, TB9, TB10, and TB14) among the first to eighteenth touch bridges TB1 to TB18 disposed in the area of the second touch electrode TE2 through the plurality of corresponding first contact holes CNT1, and is electrically connected to the tenth and fourteenth touch bridges TB10 and TB14 disposed in the area of the first touch electrode TEL and to the fifth and ninth touch bridges TB5 and TB9 disposed in the area of the third touch electrode TE3 through the plurality of corresponding first contact holes CNT1.

In addition, the fifth and ninth touch bridges TB5 and TB9 disposed in the area of the second touch electrode TE2 are electrically connected to the first touch line TL1 through the corresponding first contact holes CNT1, and the tenth and fourteenth touch bridges TB10 and TB14 disposed in the area of the second touch electrode TE2 are electrically connected to the third touch line TL3 through the corresponding first contact holes CNT1.

The seventh case (case7) is a case in which the second touch line TL2 is electrically connected to touch bridges TB1, TB2, TB4 to TB6, TB8 to TB11, TB13 to TB15, TB17, and TB18 (but not to the third, seventh, twelfth, and sixteenth touch bridges TB3, TB7, TB12, and TB16) among the first to eighteenth touch bridges TB1 to TB18 disposed in the area of the second touch electrode TE2 through the plurality of corresponding first contact holes CNT1, and is electrically connected to the twelfth and sixteenth touch bridges TB12 and TB16 disposed in the area of the first touch electrode TE1 and to the third and seventh touch bridges TB3 and TB7 disposed in the area of the third touch electrode TE3 through the plurality of corresponding first contact holes CNT1.

In addition, the third and seventh touch bridges TB3 and TB7 disposed in the area of the second touch electrode TE2 are electrically connected to the first touch line TL1 through the corresponding first contact holes CNT1, and the twelfth and sixteenth touch bridges TB12 and TB16 disposed in the area of the second touch electrode TE2 are electrically connected to the third touch line TL3 through the corresponding first contact holes CNT1.

The eighth case (case8) is a case in which the second touch line TL2 is electrically connected to touch bridges TB1, TB3, TB4, TB6 to TB13, TB15, TB16, and TB18 (but not to the second, fifth, fourteenth, and seventeenth touch bridges TB2, TB5, TB14, and TB17) among the first to eighteenth touch bridges TB1 to TB18 disposed in the area of the second touch electrode TE2 through the plurality of corresponding first contact holes CNT1, and is electrically connected to the fourteenth and seventeenth touch bridges TB14 and TB17 disposed in the area of the first touch electrode TE1 and to the second and fifth touch bridges TB2 and TB5 disposed in the area of the third touch electrode TE3 through the plurality of corresponding first contact holes CNT1.

In addition, the second and fifth touch bridges TB2 and TB5 disposed in the area of the second touch electrode TE2 are electrically connected to the first touch line TL1 through the corresponding first contact holes CNT1, and the fourteenth and seventeenth touch bridges TB14 and TB17 disposed in the area of the second touch electrode TE2 are electrically connected to the third touch line TL3 through the corresponding first contact holes CNT1.

The ninth case (case9) is a case in which the second touch line TL2 is electrically connected to touch bridges TB2, TB4 to TB15, and TB17 (but not to the first, third, sixteenth, and eighteenth touch bridges TB1, TB3, TB16, and TB18) among the first to eighteenth touch bridges TB1 to TB18 disposed in the area of the second touch electrode TE2 through the plurality of corresponding first contact holes CNT1, and is electrically connected to the sixteenth and eighteenth touch bridges TB16 and TB18 disposed in the area of the first touch electrode TE1 and to the first and third touch bridges TB1 and TB3 disposed in the area of the third touch electrode TE3 through the plurality of corresponding first contact holes CNT1.

In addition, the first and third touch bridges TB1 and TB3 disposed in the area of the second touch electrode TE2 are electrically connected to the first touch line TL1 through the corresponding first contact holes CNT1, and the sixteenth and eighteenth touch bridges TB16 and TB18 disposed in the area of the second touch electrode TE2 are electrically connected to the third touch line TL3 through the corresponding first contact holes CNT1.

As shown in FIG. 26, tenth and eleventh cases (case10 and case11) are example cases in which the second touch line TL2 may be electrically connected to all but six touch bridges among the plurality of touch bridges TB1 to TB18 disposed in the area of the second touch electrode TE2 through the plurality of corresponding first contact holes CNT1, as described for example with reference to FIG. 24.

The second touch line TL2 may be electrically connected to three of the plurality of touch bridges TB1 to TB18 disposed in the area of the first touch electrode TE1 and to three of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, three of the six touch bridges not electrically connected to the second touch line TL2 may be electrically connected to the first touch line TL1, and the three remaining touch bridges may be electrically connected to the third touch line TL3.

In detail, the tenth case (case10) is a case in which the second touch line TL2 is electrically connected to touch bridges TB2, TB4, TB6 to TB13, TB15, and TB17 (but not to the first, third, fifth, fourteenth, sixteenth, and eighteenth touch bridges TB1, TB3, TB5, TB14, TB16, and TB18) among the first to eighteenth touch bridges TB1 to TB18 disposed in the area of the second touch electrode TE2 through the plurality of corresponding first contact holes CNT1, and is electrically connected to the fourteenth, sixteenth, and eighteenth touch bridges TB14, TB16, and TB18 disposed in the area of the first touch electrode TE1 and to the first, third, and fifth touch bridges TB1, TB3, and TB5 disposed in the area of the third touch electrode TE3 through the plurality of corresponding first contact holes CNT1.

In addition, the first, third, and fifth touch bridges TB1, TB3, and TB5 disposed in the area of the second touch electrode TE2 are electrically connected to the first touch line TL1 through the corresponding first contact holes CNT1, and the fourteenth, sixteenth, and eighteenth touch bridges TB14, TB16, and TB18 disposed in the area of the second touch electrode TE2 are electrically connected to the third touch line TL3 through the corresponding first contact holes CNT1.

The eleventh case (case11) is a case in which the second touch line TL2 is electrically connected to touch bridges TB4 to TB15 (but not to the first to third and sixteenth to eighteenth touch bridges TB1 to TB3 and TB16 to TB18) among the first to eighteenth touch bridges TB1 to TB18 disposed in the area of the second touch electrode TE2 through the plurality of corresponding first contact holes CNT1, and is electrically connected to the sixteenth to eighteenth touch bridges TB16 to TB18 disposed in the area of the first touch electrode TE1 and to the first to third touch bridges TB1 to TB3 disposed in the area of the third touch electrode TE3 through the plurality of corresponding first contact holes CNT1.

In addition, the first to third touch bridges TB1 to TB3 disposed in the area of the second touch electrode TE2 are electrically connected to the first touch line TL1 through the corresponding first contact holes CNT1, and the sixteenth to eighteenth touch bridges TB16 to TB18 disposed in the area of the second touch electrode TE2 are electrically connected to the third touch line TL3 through the corresponding first contact holes CNT1.

As shown in FIG. 26, a twelfth case (case12) is an example case in which the second touch line TL2 may be electrically connected to all but eight touch bridges among the plurality of touch bridges TB1 to TB18 disposed in the area of the second touch electrode TE2 through the plurality of corresponding first contact holes CNT1, as described for example with reference to FIG. 25.

The second touch line TL2 may be electrically connected to four of the plurality of touch bridges TB1 to TB18 disposed in the area of the first touch electrode TEL and to four of the plurality of touch bridges TB1 to TB18 disposed in the area of the third touch electrode TE3 through the plurality of corresponding first contact holes CNT1.

In addition, among the plurality of touch bridges TB1 to TB18 disposed in the area of the second touch electrode TE2, four of the eight touch bridges not electrically connected to the second touch line TL2 may be electrically connected to the first touch line TL1, and the four remaining touch bridges may be electrically connected to the third touch line TL3.

In detail, the twelfth case (case12) is a case in which the second touch line TL2 is electrically connected to touch bridges TB5 to TB14 (but not to the first to fourth and fifteenth to eighteenth touch bridges TB1 to TB4 and TB15 to TB18) among the first to eighteenth touch bridges TB1 to TB18 disposed in the area of the second touch electrode TE2 through the plurality of corresponding first contact holes CNT1, and is electrically connected to the fifteenth to eighteenth touch bridges TB15 to TB18 disposed in the area of the first touch electrode TE1 and to the first to fourth touch bridges TB1 to TB4 disposed in the area of the third touch electrode TE3 through the plurality of corresponding first contact holes CNT1.

In addition, the first to fourth touch bridges TB1 to TB4 disposed in the area of the second touch electrode TE2 are electrically connected to the first touch line TL1 through the corresponding first contact holes CNT1, and the fifteenth to eighteenth touch bridges TB15 to TB18 disposed in the area of the second touch electrode TE2 are electrically connected to the third touch line TL3 through the corresponding first contact holes CNT1.

The exemplary embodiments described with reference to FIGS. 17 to 26 will be summarized as follows.

At least first to third touch electrodes TE1 to TE3 may be disposed in one column, and at least first to third touch lines TL1, TL2, and TL3 may be disposed so as to respectively correspond to, overlap with, or connect to the first to third touch electrodes TE1 to TE3. The first to third touch electrodes TE1 to TE3 may be connected to the touch driving circuit (160 in FIG. 1) via the first to third touch lines TL1, TL2, and TL3.

m×n touch cathode electrodes TCE may be disposed in a matrix form ("n" rows and "m" columns) in the area of each of the first to third touch electrodes TE1 to TE3.

Among the m×n touch cathode electrodes TCE disposed in the area of each of the touch electrodes TE1 to TE3, "m" touch cathode electrodes TCE disposed in each row may be electrically connected to each other via one touch bridge TB.

Accordingly, "n" touch bridges TB1 to TB18 may be disposed in the area of each of the touch electrode TE1 to TE3.

The second touch line TL2 may be electrically connected to all but at least one pair of touch bridges, the number of which is less than n/2, among the "n" touch bridges TB1 to TB18 disposed in the area of the second touch electrode TE2 through the plurality of corresponding contact holes CNT1.

The second touch line TL2 may also be electrically connected to at least one of the plurality of touch bridges TB1 to TB18 disposed in the area of the first touch electrode TEL and to at least one of the plurality of touch bridges TB1 to TB18 disposed in the area of the third touch electrode TE3 through the plurality of corresponding first contact holes CNT1.

In addition, among the touch bridges disposed in the area of the second touch electrode TE2 and not electrically connected to the second touch line TL2, at least one of such touch bridges may be electrically connected to the first touch line TL1, and the other such touch bridges may be electrically connected to the third touch line TL3.

As described above, among "n" touch bridges disposed in an area of a certain touch electrode (e.g., TE2), "k" (k being a multiple of 2 and less than n/2) touch bridges are not connected to a corresponding touch line (e.g., TL2), and are shared by other touch lines (e.g., TL1 or TL3), whereby a temperature ghost may be reduced when sensing touch.

As is apparent from the above description, the transparent touch display device according to exemplary embodiments of the present disclosure has the following effect.

Among "n" touch bridges disposed in an area of a certain touch electrode (e.g., TE2), "k" (k being a multiple of 2 and less than n/2) touch bridges are not connected to a corresponding touch line (e.g., TL2), and are shared by other touch lines (e.g., TL1 or TL3), whereby a temperature ghost may be reduced when sensing touch. Thus, touch sensing accuracy may be improved.

It will be apparent to those skilled in the art that the present disclosure described above is not limited by the above-described exemplary embodiments and the accompanying drawings and that various substitutions, modifications, and variations can be made in the present disclosure without departing from the spirit, scope, or technical idea of the disclosures. Thus, it is intended that the present disclosure cover all modifications and variations of this disclosure that come within the scope of the appended claims and their equivalents.

What is claimed is:

1. A transparent touch display device, comprising:
first to third touch electrodes disposed in one column;
first to third touch lines disposed across the first to the third touch electrodes to respectively correspond to the first to the third touch electrodes;
m×n touch cathode electrodes disposed in n rows and m columns in an area of each of the first to the third touch electrodes (m and n being natural numbers); and
n touch bridges disposed in the area of each of the first to the third touch electrodes to electrically interconnect m touch cathode electrodes disposed in each of the n rows among the m×n touch cathode electrodes,
wherein the second touch line is electrically connected to each of the n–k touch bridges except for k touch bridges among the n touch bridges disposed in the area of the second touch electrode, k being an even number greater than 0 and less than n/2, and
wherein the second touch line is electrically connected to k/2 touch bridges among the n touch bridges disposed in the area of the first touch electrode and to k/2 touch bridges among the n touch bridges disposed in the area of the third touch electrode.

2. The transparent touch display device of claim 1, wherein, within the area of the second touch electrode, the second touch line is not electrically connected to the k touch bridges disposed in the area of the second touch electrode.

3. The transparent touch display device of claim 2, wherein, among the k touch bridges disposed in the area of the second touch electrode and not electrically connected to the second touch line, k/2 touch bridges are electrically connected to the first touch line, and the other k/2 touch bridges are electrically connected to the third touch line.

4. The transparent touch display device of claim 1, comprising:
a display panel including:
a pixel area configured to emit light to display an image; and
a plurality of transmissive areas configured to pass light and spaced apart from each other, the pixel area being disposed between two adjacent transmissive areas among the transmissive areas,
wherein the m×n touch cathode electrodes are disposed in the transmissive areas.

5. The transparent touch display device of claim 4, wherein the display panel further includes:
a subpixel in the pixel area and having a light emitting device configured to emit light, the light emitting device including a display cathode electrode, an anode electrode, and a light emitting layer between the display cathode electrode and the anode electrode, and
wherein the display cathode electrode and the m×n touch cathode electrodes are formed of a same cathode electrode layer and are separated from one another.

6. The transparent touch display device of claim 1, further comprising:
a subpixel between two adjacent touch cathode electrodes among the m×n touch cathode electrodes, the subpixel including a light emitting device configured to emit light and including:
a display cathode electrode;
an anode electrode overlapping with the display cathode electrode; and
a light emitting layer between the display cathode electrode and the anode electrode,
wherein the two adjacent touch cathode electrodes are formed of a same cathode electrode layer as the display cathode electrode and are separated from the display cathode electrode.

7. The transparent touch display device of claim 6, wherein:
one of the two adjacent touch cathode electrodes and the display cathode electrode are disposed on a same underlying layer, and
the underlying layer has an undercut structure at a boundary between the one of the two adjacent touch cathode electrodes and the display cathode electrode to separate the one of the two adjacent touch cathode electrodes from the display cathode electrode.

8. The transparent touch display device of claim 7, wherein the underlying layer is one of a passivation layer and an insulating layer.

9. The transparent touch display device of claim 6, further comprising:
a substrate on which the subpixel and the m×n touch cathode electrodes are disposed,
wherein the display cathode electrode is disposed farther away from the substrate than one of the two adjacent touch cathode electrodes.

10. The transparent touch display device of claim 6, wherein:
the cathode electrode layer includes a transparent conductive material, and
the anode electrode includes a reflective metal material and does not overlap with the two adjacent touch cathode electrodes.

11. The transparent touch display device of claim 1, wherein the second touch electrode is disposed between the first touch electrode and the third touch electrode.

12. A transparent touch display device, comprising:
first to third touch electrodes disposed in one column;
first to third touch lines disposed across the first to the third touch electrodes to respectively correspond to the first to the third touch electrodes;
m×n touch cathode electrodes disposed in n rows and m columns in an area of each of the first to the third touch electrodes (m and n being natural numbers); and
n touch bridges disposed in the area of each of the first to the third touch electrodes to electrically interconnect m touch cathode electrodes disposed in each of the n rows among the m×n touch cathode electrodes, wherein, within the area of the second touch electrode, the second touch line is electrically connected to each of n–k touch bridges and not to the remaining k touch bridges among the n touch bridges disposed in the area of the second touch electrode, k being an even number greater than 0 and less than n/2, and wherein, among the k touch bridges disposed in the area of the second touch electrode and not electrically connected to the second touch line, k/2 touch bridges are electrically connected to the first touch line, and the other k/2 touch bridges are electrically connected to the third touch line.

13. The transparent touch display device of claim 12, comprising:

a display panel including:

a pixel area configured to emit light to display an image; and a plurality of transmissive areas configured to pass light and spaced apart from each other, the pixel area being disposed between two adjacent transmissive areas among the transmissive areas, wherein the m×n touch cathode electrodes are disposed in the transmissive areas.

14. The transparent touch display device of claim 13, wherein the display panel further includes:

a subpixel in the pixel area and having a light emitting device configured to emit light, the light emitting device including a display cathode electrode, an anode electrode, and a light emitting layer between the display cathode electrode and the anode electrode, and wherein the display cathode electrode and the m×n touch cathode electrodes are formed of a same cathode electrode layer and are separated from one another.

15. The transparent touch display device of claim 12, further comprising:

a subpixel between two adjacent touch cathode electrodes among the m×n touch cathode electrodes, the subpixel including a light emitting device configured to emit light and including:

a display cathode electrode;

an anode electrode overlapping with the display cathode electrode; and a light emitting layer between the display cathode electrode and the anode electrode, wherein the two adjacent touch cathode electrodes are formed of a same cathode electrode layer as the display cathode electrode and are separated from the display cathode electrode.

16. The transparent touch display device of claim 15, wherein:

one of the two adjacent touch cathode electrodes and the display cathode electrode are disposed on a same underlying layer, and the underlying layer has an undercut structure at a boundary between the one of the two adjacent touch cathode electrodes and the display cathode electrode to separate the one of the two adjacent touch cathode electrodes from the display cathode electrode.

17. The transparent touch display device of claim 16, wherein the underlying layer is one of a passivation layer and an insulating layer.

18. The transparent touch display device of claim 15, further comprising:

a substrate on which the subpixel and the m×n touch cathode electrodes are disposed, wherein the display cathode electrode is disposed farther away from the substrate than one of the two adjacent touch cathode electrodes.

19. The transparent touch display device of claim 15, wherein:

the cathode electrode layer includes a transparent conductive material, and the anode electrode includes a reflective metal material and does not overlap with the two adjacent touch cathode electrodes.

20. The transparent touch display device of claim 12, wherein:

the second touch line is electrically connected to k/2 touch bridges among the n touch bridges disposed in the area of the first touch electrode and to k/2 touch bridges among the n touch bridges disposed in the area of the third touch electrode, and the second touch electrode is disposed between the first touch electrode and the third touch electrode.

* * * * *